(12) United States Patent
Paul

(10) Patent No.: US 12,236,174 B1
(45) Date of Patent: Feb. 25, 2025

(54) SYSTEM AND METHOD FOR ESTIMATING AMPACITY OF MULTIPLE BARE OVERHEAD CONDUCTORS IN A RANGE OF AMBIENT TEMPERATURES WITHIN A SINGLE SIMULATION

(71) Applicant: Sushanta Paul, Rochester, NY (US)

(72) Inventor: Sushanta Paul, Rochester, NY (US)

( * ) Notice: Subject to any disclaimer, the term of this patent is extended or adjusted under 35 U.S.C. 154(b) by 0 days.

(21) Appl. No.: 18/419,920

(22) Filed: Jan. 23, 2024

(51) Int. Cl.
  *G06F 30/20* (2020.01)

(52) U.S. Cl.
  CPC .................. *G06F 30/20* (2020.01)

(58) Field of Classification Search
  CPC .............. G06F 1/0021; G06F 2113/16; G06F 2119/08; G06F 30/367
  See application file for complete search history.

(56) References Cited

U.S. PATENT DOCUMENTS

| | | | | |
|---|---|---|---|---|
| 7,516,051 | B2 * | 4/2009 | Johnson | G06F 30/20 |
| | | | | 703/2 |
| 7,643,977 | B2 * | 1/2010 | Bertini | H01B 7/285 |
| | | | | 174/15.1 |
| 9,784,766 | B2 * | 10/2017 | Lindsey | G01R 15/142 |
| 10,317,570 | B2 * | 6/2019 | Lilien | G06F 17/00 |

* cited by examiner

*Primary Examiner* — Andy Ho
(74) *Attorney, Agent, or Firm* — Cygnet IP Law; Stephen W. Aycock, II

(57) ABSTRACT

Methods, systems and computer readable media for estimating ampacity of single and multiple bare overhead conductors in a range of ambient temperatures within a single simulation, are described.

20 Claims, 32 Drawing Sheets

Page 14
AA currentsfnor1_1 = currentsf, currentavgnor1_1 = currentavg, tcorenor1_1 = tcore, tavgnor1_1 = tavg, ravgnor1_1 = ravg, when i = 1 & n = 1
........
currentsfnor1_35 = currentsf, currentavgnor1_35 = currentavg, tcorenor1_35 = tcore, tavgnor1_35 = tavg, ravgnor1_35 = ravg, when i = 1 & n = 35
currentsfnor2_1 = currentsf, currentavgnor2_1 = currentavg, tcorenor2_1 = tcore, tavgnor2_1 = tavg, ravgnor2_1 = ravg, when i = 2 & n = 1
........
currentsfnor2_35 = currentsf, currentavgnor2_35 = currentavg, tcorenor2_35 = tcore, tavgnor2_35 = tavg, ravgnor2_35 = ravg, when i = 2 & n = 35
currentsfnor3_1 = currentsf, currentavgnor3_1 = currentavg, tcorenor3_1 = tcore, tavgnor3_1 = tavg, ravgnor3_1 = ravg, when i = 3 & n = 35
........
currentsfnor3_35 = currentsf, currentavgnor3_35 = currentavg, tcorenor3_35 = tcore, tavgnor3_35 = tavg, ravgnor3_35 = ravg, when i = 3 & n = 35
currentsfnor4_1 = currentsf, currentavgnor4_1 = currentavg, tcorenor4_1 = tcore, tavgnor4_1 = tavg, ravgnor4_1 = ravg, when i = 4 & n = 1
........
currentsfnor4_35 = currentsf, currentavgnor4_35 = currentavg, tcorenor4_35 = tcore, tavgnor4_35 = tavg, ravgnor4_35 = ravg, when i = 4 & n = 35
currentsfnor5_1 = currentsf, currentavgnor5_1 = currentavg, tcorenor5_1 = tcore, tavgnor5_1 = tavg, ravgnor5_1 = ravg, when i = 5 & n = 1
........
currentsfnor5_35 = currentsf, currentavgnor5_35 = currentavg, tcorenor5_35 = tcore, tavgnor5_35 = tavg, ravgnor5_35 = ravg, when i = 5 & n = 35
currentsfnor6_1 = currentsf, currentavgnor6_1 = currentavg, tcorenor6_1 = tcore, tavgnor6_1 = tavg, ravgnor6_1 = ravg, when i = 6 & n = 1
........
currentsfnor6_35 = currentsf, currentavgnor6_35 = currentavg, tcorenor6_35 = tcore, tavgnor6_35 = tavg, ravgnor6_35 = ravg, when i = 6 & n = 35
currentsfnor7_1 = currentsf, currentavgnor7_1 = currentavg, tcorenor7_1 = tcore, tavgnor7_1 = tavg, ravgnor7_1 = ravg, when i = 7 & n = 1
........
currentsfnor7_35 = currentsf, currentavgnor7_35 = currentavg, tcorenor7_35 = tcore, tavgnor7_35 = tavg, ravgnor7_35 = ravg, when i = 7 & n = 35
currentsfnor8_1 = currentsf, currentavgnor8_1 = currentavg, tcorenor8_1 = tcore, tavgnor8_1 = tavg, ravgnor8_1 = ravg, when i = 8 & n = 1
........
currentsfnor8_35 = currentsf, currentavgnor8_35 = currentavg, tcorenor8_35 = tcore, tavgnor8_35 = tavg, ravgnor8_35 = ravg, when i = 8 & n = 35
currentsfnor9_1 = currentsf, currentavgnor9_1 = currentavg, tcorenor9_1 = tcore, tavgnor9_1 = tavg, ravgnor9_1 = ravg, when i = 9 & n = 1
........
currentsfnor9_35 = currentsf, currentavgnor9_35 = currentavg, tcorenor9_35 = tcore, tavgnor9_35 = tavg, ravgnor9_35 = ravg, when i = 9 & n = 35
currentsfnor10_1 = currentsf, currentavgnor10_1 = currentavg, tcorenor10_1 = tcore, tavgnor10_1 = tavg, ravgnor10_1 = ravg, when i = 10 & n = 1
........
currentsfnor10_35 = currentsf, currentavgnor10_35 = currentavg, tcorenor10_35 = tcore, tavgnor10_35 = tavg, ravgnor10_35 = ravg, when i = 10 & n = 35
currentsfLTE1_1 = currentsf, currentavgLTE1_1 = currentavg, tcoreLTE1_1 = tcore, tavgLTE1_1 = tavg, ravgLTE1_1 = ravg, when i = 11 & n = 1
........
currentsfLTE1_35 = currentsf, currentavgLTE1_35 = currentavg, tcoreLTE1_35 = tcore, tavgLTE1_35 = tavg, ravgLTE1_35 = ravg, when i = 11 & n = 35
currentsfLTE2_1 = currentsf, currentavgLTE2_1 = currentavg, tcoreLTE2_1 = tcore, tavgLTE2_1 = tavg, ravgLTE2_1 = ravg, when i = 12 & n = 1
........
currentsfLTE2_35 = currentsf, currentavgLTE2_35 = currentavg, tcoreLTE2_35 = tcore, tavgLTE2_35 = tavg, ravgLTE2_35 = ravg, when i = 12 & n = 35
currentsfLTE3_1 = currentsf, currentavgLTE3_1 = currentavg, tcoreLTE3_1 = tcore, tavgLTE3_1 = tavg, ravgLTE3_1 = ravg, when i = 13 & n = 35
........
currentsfLTE3_35 = currentsf, currentavgLTE3_35 = currentavg, tcoreLTE3_35 = tcore, tavgLTE3_35 = tavg, ravgLTE3_35 = ravg, when i = 13 & n = 35
currentsfLTE4_1 = currentsf, currentavgLTE4_1 = currentavg, tcoreLTE4_1 = tcore, tavgLTE4_1 = tavg, ravgLTE4_1 = ravg, when i = 14 & n = 1
........
currentsfLTE4_35 = currentsf, currentavgLTE4_35 = currentavg, tcoreLTE4_35 = tcore, tavgLTE4_35 = tavg, ravgLTE4_35 = ravg, when i = 14 & n = 35
currentsfLTE5_1 = currentsf, currentavgLTE5_1 = currentavg, tcoreLTE5_1 = tcore, tavgLTE5_1 = tavg, ravgLTE5_1 = ravg, when i = 15 & n = 1
........
currentsfLTE5_35 = currentsf, currentavgLTE5_35 = currentavg, tcoreLTE5_35 = tcore, tavgLTE5_35 = tavg, ravgLTE5_35 = ravg, when i = 15 & n = 35
currentsfLTE6_1 = currentsf, currentavgLTE6_1 = currentavg, tcoreLTE6_1 = tcore, tavgLTE6_1 = tavg, ravgLTE6_1 = ravg, when i = 16 & n = 1
........
currentsfLTE6_35 = currentsf, currentavgLTE6_35 = currentavg, tcoreLTE6_35 = tcore, tavgLTE6_35 = tavg, ravgLTE6_35 = ravg, when i = 16, n = 35

Page 16
BB

FIG. 3O

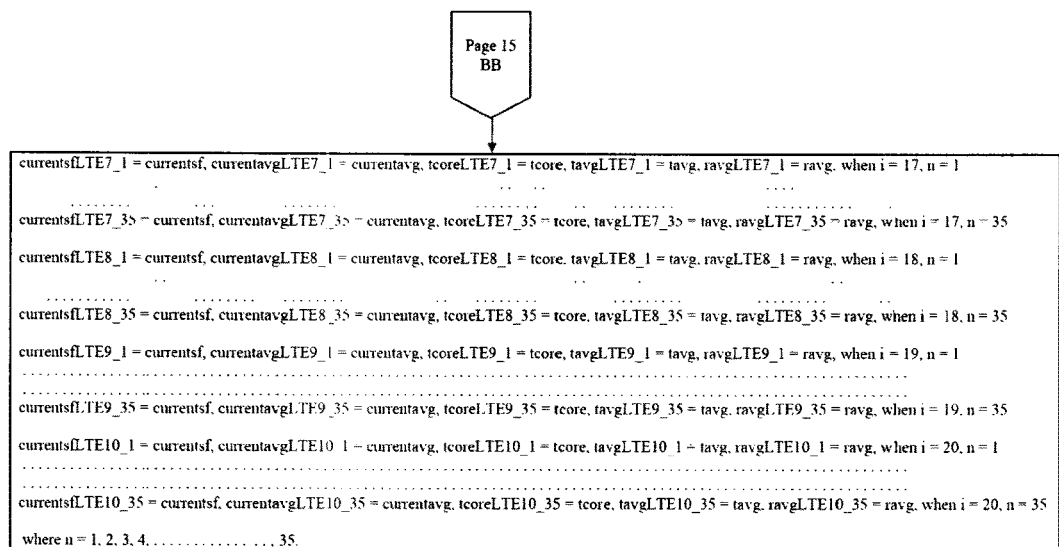

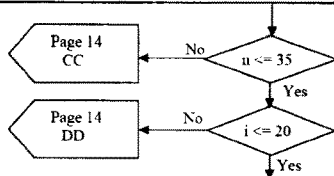

Print:
Conductor -1 normal ratings at conductor surface temperature:
currentsfnor1_k
Conductor -1 normal ratings at conductor average temperature:
currentavgnor1_k Conductor -2 normal ratings at conductor surface temperature:
Currentsfnor2_k
Conductor -2 normal ratings at conductor average temperature:
Currentavgnor2_k Conductor -3 normal ratings at conductor surface temperature:
Currentsfnor3_k
Conductor -3 normal ratings at conductor average temperature:
Currentavgnor3_k Conductor -4 normal ratings at conductor surface temperature:
Currentsfnor4_k
Conductor -4 normal ratings at conductor average temperature:
Currentavgnor4_k Conductor -5 normal ratings at conductor surface temperature:
Currentsfnor5_k
Conductor -5 normal ratings at conductor average temperature:
Currentavgnor5_k Conductor -6 normal ratings at conductor surface temperature:
Currentsfnor6_k
Conductor -6 normal ratings at conductor average temperature:
Currentavgnor6_k Conductor -7 normal ratings at conductor surface temperature:
Currentsfnor7_k
Conductor -7 normal ratings at conductor average temperature:
Currentavgnor7_k Conductor -8 normal ratings at conductor surface temperature:
Currentsfnor8_k
Conductor -8 normal ratings at conductor average temperature:
currentavgnor1_k Conductor -9 normal ratings at conductor surface temperature:
Currentsfnor9_k
Conductor -9 normal ratings at conductor average temperature:
Currentavgnor9_k Conductor -10 normal ratings at conductor surface temperature:
Currentsfnor10_k
Conductor -10 normal ratings at conductor average temperature:
Currentavgnor10_k where k = 1, 2, 3, 4, . . . . . . . . . . . . . . . . 35.

FIG. 3P

SYSTEM AND METHOD FOR ESTIMATING AMPACITY OF MULTIPLE BARE OVERHEAD CONDUCTORS IN A RANGE OF AMBIENT TEMPERATURES WITHIN A SINGLE SIMULATION

TECHNICAL FIELD

Embodiments relate generally to computer systems and methods for electrical engineering, and more particularly, to methods, systems and computer readable media for estimating ampacity of single and multiple bare overhead conductors in a range of ambient temperatures within a single simulation.

BACKGROUND

Ampacity is the maximum current that a conductor can carry continuously under the conditions of use without exceeding its temperature rating. Right now, utilities are using a fixed ambient temperature for conductor summer and winter ampacity ratings. In 2021, FERC (the Federal Energy Regulatory Commission) issued an order called FERC order 881 that states by 2025 all utilities shall implement Ambient Adjusted Rating (AAR) for their transmission lines and compute AAR rating shall at least once each hour. AAR rates the transmission capacity of overhead lines based on ambient temperature, and potentially other factors.

To meet this requirement for hourly AAR computation or simulation, a system may be required that is configured to perform conductor rating calculations in a batch to prepare a lookup table for conductor ratings. Utilities and engineering consulting firms may require a software application that can do the batch calculations. Conventional software may only be able to perform ampacity calculations for one conductor considering only one ambient temperature with one operating condition and one calculation method in a single simulation. Thus, the conventional systems would possibly require ampacity to be simulated 2800 times to get 2800 ratings of 10 conductors for 35 different ambient temperatures, with four operating conditions and two calculation methods. This can be cumbersome and time consuming for the utilities or energy consulting firms.

Some implementations were conceived in light of the above-mentioned needs, problems and/or limitations, among other things.

The background description provided herein is for the purpose of generally presenting the context of the disclosure. Work of the presently named inventor(s), to the extent it is described in this background section, as well as aspects of the description that may not otherwise qualify as prior art at the time of filing, are neither expressly nor impliedly admitted as prior art against the present disclosure.

SUMMARY

Some implementations can include systems and methods (e.g., embodied as a C computer software program) are disclosed, where the systems and methods are configured to calculate the ampacities of a given number (e.g., 10) bare overhead conductors with a wide range of ambient temperatures, considering the Normal, LTE (Long Term Emergency), STE (Short Term Emergency) and DAL (Drastic Action Limit) operating conditions with the calculation method based on both conductor surface temperature and average temperature of surface and core in a single simulation. For example, if maximum ambient temperature is selected as 120° F. with 5° F. decrement in a step, this program can calculate 10 (ten) conductors ampacities for 35 different ambient temperatures from 120° F. to −50° F. in 5° F. intervals, i.e. the system and methods can generate 350 ratings for Normal, 350 ratings for LTE, 350 ratings for STE and 350 ratings for DAL considering the calculation method based on conductor surface temperature and also 350 ratings for Normal, 350 ratings for LTE, 350 ratings for STE and 350 ratings for DAL considering the calculation method based on conductor average temperature of surface and core, generating total 2800 ratings in a single simulation.

Some implementations can include an option to choose either multiple conductors (e.g., 10 conductors) or 1 conductor for ampacity calculation. If one conductor is selected, the system/method can produce a total of 280 ratings for 35 different ambient temperatures with four operating conditions and two calculation methods in a single simulation.

The ampacity calculations performed in this disclosed method are based on IEEE Standard 738. For ampacity calculation, IEEE Standard 738-2006 considers conductor surface temperature whereas IEEE Standard 738-2012 considers average temperature of conductor core and surface temperatures. In some implementations, ampacity calculations are performed based on both methods to match with existing legacy ratings that are calculated based on either one of the methods. In some conventional commercial software, the ampacity calculation is performed for one conductor considering only one ambient temperature with one operating condition and one calculation method in a single simulation, i.e., it needs to be simulated 2800 times to get 2800 ratings of 10 conductors for 35 different ambient temperatures, with 4 operating conditions and 2 calculation methods mentioned above. Thus, an implementation of the disclosed subject matter would provide a technical solution to the above-mentioned technical problem.

DETAILED DESCRIPTION

Figure 1:
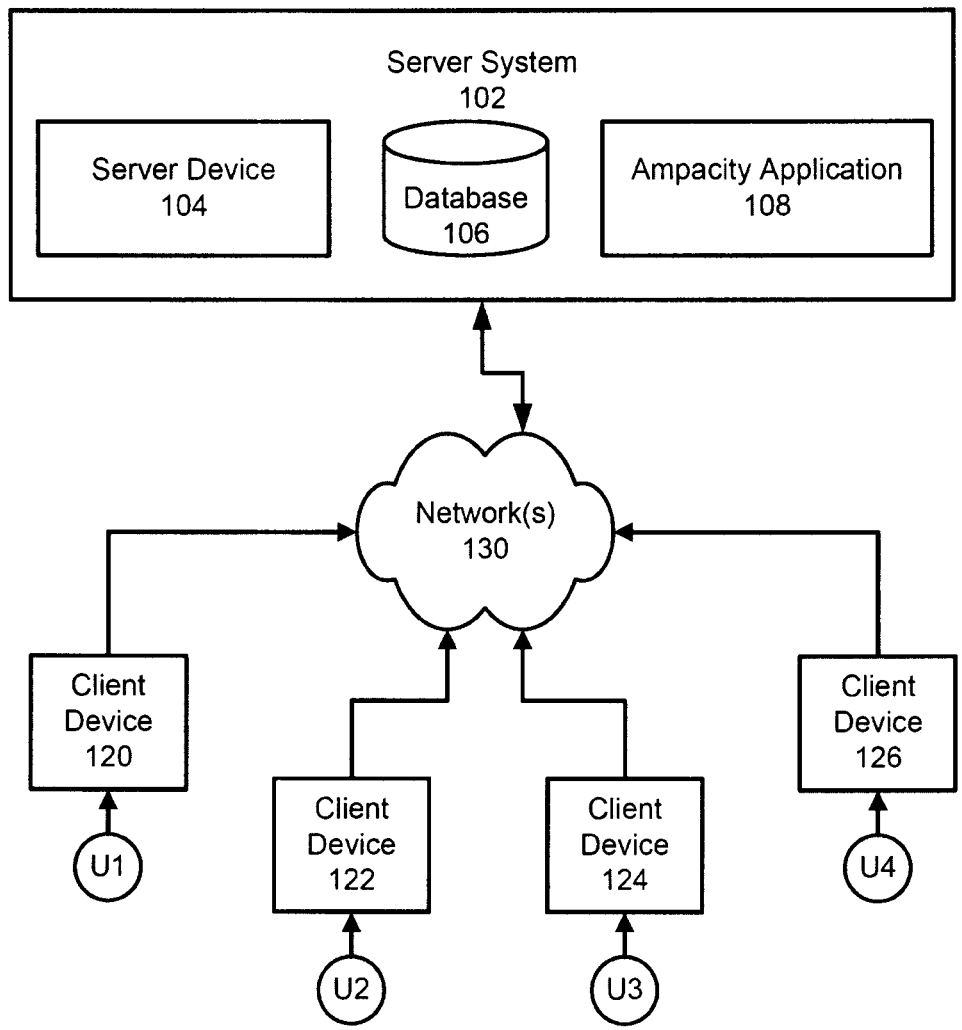
FIG. 1 shows a network environment with client and server devices that can be configured to perform ampacity methods in accordance with some implementations.

FIG. 1 illustrates a block diagram of an example network environment 100, which may be used in some implementations described herein. In some implementations, network environment 100 includes one or more server systems, e.g., server system 102 in the example of FIG. 1. Server system 102 can communicate with a network 130, for example. Server system 102 can include a server device 104 and a database 106 or other data store or data storage device. Network environment 100 also can include one or more client devices, e.g., client devices 120, 122, 124, and 126, which may communicate with each other and/or with server system 102 via network 130. Network 130 can be any type of communication network, including one or more of the Internet, local area networks (LAN), wireless networks, switch or hub connections, etc. In some implementations, network 130 can include peer-to-peer communication 132 between devices, e.g., using peer-to-peer wireless protocols.

For ease of illustration, FIG. 1 shows one block for server system 102, server device 104, and database 106, and shows four blocks for client devices 120, 122, 124, and 126. Some blocks (e.g., 102, 104, and 106) may represent multiple systems, server devices, and network databases, and the blocks can be provided in different configurations than shown. For example, server system 102 can represent multiple server systems that can communicate with other server systems via the network 130. In some examples, database 106 and/or other storage devices can be provided in server system block(s) that are separate from server device 104 and can communicate with server device 104 and other server systems via network 130. Also, there may be any number of client devices. Each client device can be any type of electronic device, e.g., desktop computer, laptop computer, portable or mobile device, camera, cell phone, smart phone, tablet computer, television, TV set top box or entertainment device, wearable devices (e.g., display glasses or goggles, head-mounted display (HMD), wristwatch, headset, armband, jewelry, etc.), virtual reality (VR) and/or augmented reality (AR) enabled devices, personal digital assistant (PDA), media player, game device, etc. Some client devices may also have a local database similar to database 106 or other storage. In other implementations, network environment 100 may not have all of the components shown and/or may have other elements including other types of elements instead of, or in addition to, those described herein.

In various implementations, end-users U1, U2, U3, and U4 may communicate with server system 102 and/or each other using respective client devices 120, 122, 124, and 126. In some examples, users U1, U2, U3, and U4 may interact with each other via applications running on respective client devices and/or server system 102, and/or via a network service, e.g., an image sharing service, a messaging service, a social network service or other type of network service, implemented on server system 102. For example, respective client devices 120, 122, 124, and 126 may communicate data to and from one or more server systems (e.g., server system 102). In some implementations, the server system 102 may provide appropriate data to the client devices such that each client device can receive communicated content or shared content uploaded to the server system 102 and/or network service. In some examples, the users can interact via audio or video conferencing, audio, video, or text chat, or other communication modes or applications. In some examples, the network service can include any system allowing users to perform a variety of communications, form links and associations, upload and post shared content such as images, image compositions (e.g., albums that include one or more images, image collages, videos, etc.), audio data, and other types of content, receive various forms of data, and/or perform socially-related functions. For example, the network service can allow a user to send messages to particular or multiple other users, form social links in the form of associations to other users within the network service, group other users in user lists, friends lists, or other user groups, post or send content including text, images, image compositions, audio sequences or recordings, or other types of content for access by designated sets of users of the network service, participate in live video, audio, and/or text videoconferences or chat with other users of the service, etc. In some implementations, a "user" can include one or more programs or virtual entities, as well as persons that interface with the system or network.

A user interface can enable display of images, image compositions, data, and other content as well as communications, privacy settings, notifications, and other data on client devices 120, 122, 124, and 126 (or alternatively on server system 102). Such an interface can be displayed using software on the client device, software on the server device, and/or a combination of client software and server software executing on server device 104, e.g., application software or client software in communication with server system 102. The user interface can be displayed by a display device of a client device or server device, e.g., a display screen, projector, etc. In some implementations, application programs running on a server system can communicate with a client device to receive user input at the client device and to output data such as visual data, audio data, etc. at the client device.

In some implementations, server system 102 and/or one or more client devices 120-126 can provide ampacity calculation as described herein.

Various implementations of features described herein can use any type of system and/or service. Any type of electronic device can make use of features described herein. Some implementations can provide one or more features described herein on client or server devices disconnected from or intermittently connected to computer networks.

Figure 2:
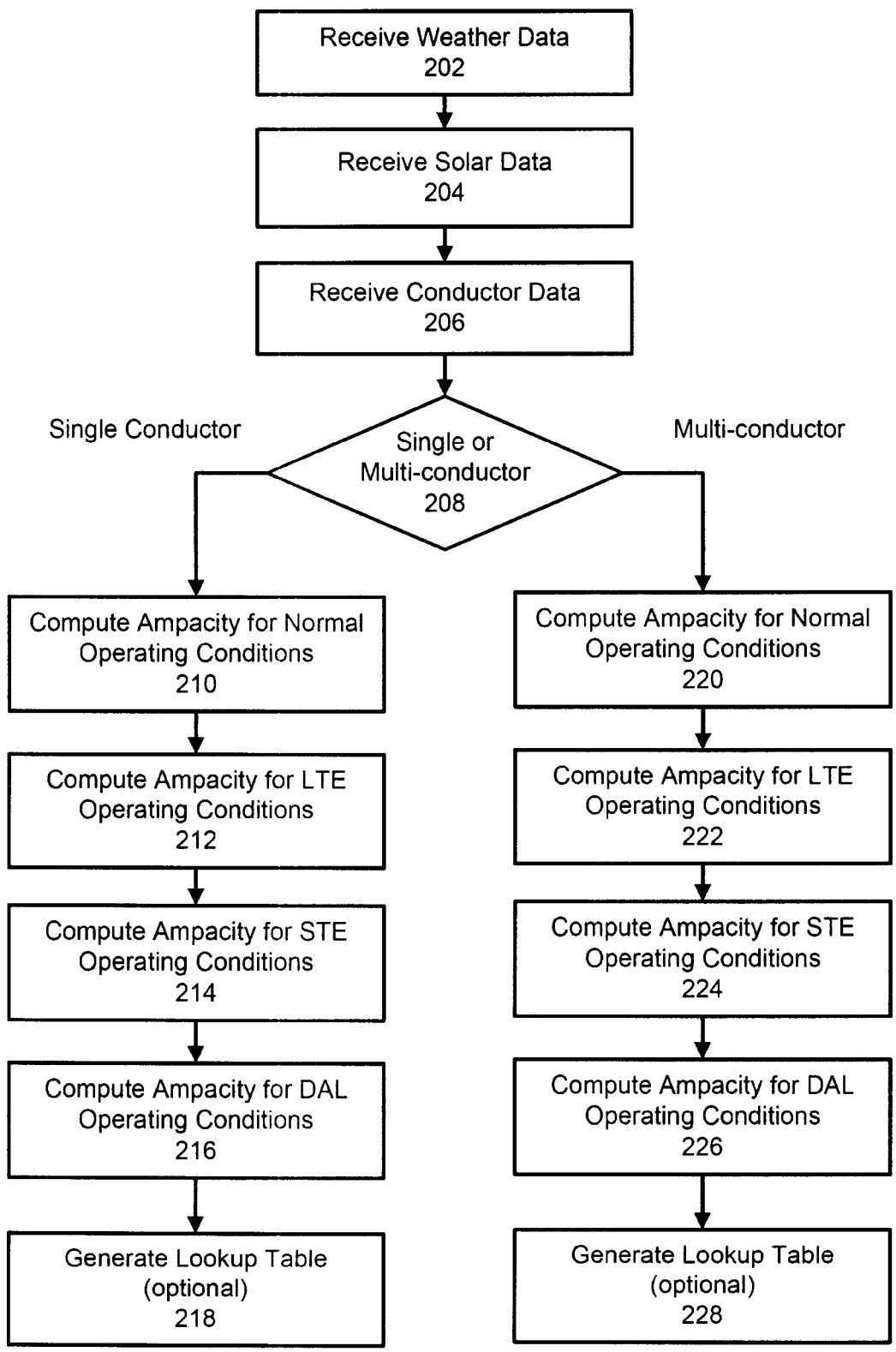
FIG. 2 is a flowchart showing an example method of computing ampacity in accordance with some implementations.

FIG. 2 shows an example method of multi-conductor ampacity calculations across a range of temperatures. The flowchart of FIG. 2 is a high-level flowchart of the method shown in detail in FIGS. 3A-3CC. Processing begins at 202, where weather data is received as input. The weather data can include one or more of maximum air temperature, air temperature decrement, wind speed, wind angle, and atmosphere type. Processing continues to 204.

At 204, solar data is received. The solar data can include one or more of month, day, AM/PM, time, and latitude. Processing continues to 206.

At 206, conductor data is received. The conductor data can include one or more of number of conductors, conductor type, and conductor parameters. Processing continues to 208.

At 208, a determination is made whether the conductor data is for a single conductor or multiple conductors. If single, processing continues to 210. If multiple conductors, processing continues to 220.

At 210, ampacity for normal conditions is computed. Processing continues to 212.

At 212, ampacity for LTE conditions is computed. Processing continues to 214.

At 214, ampacity for STE conditions is computed. Processing continues to 216.

At 216, ampacity for DAL operating conditions is computed. Processing continues to 218.

At 218, a lookup table is optionally generated. The output from 210-216 can be used to generate the lookup table or the output can be provided via a display, print out, or sent electronically to an internal or external system.

At 220, ampacity for normal conditions is computed. Processing continues to 222.

At 222, ampacity for LTE conditions is computed. Processing continues to 224.

At 224, ampacity for STE conditions is computed. Processing continues to 226.

At 226, ampacity for DAL operating conditions is computed. Processing continues to 228.

At 228, a lookup table is optionally generated. The output from 220-226 can be used to generate the lookup table or the output can be provided via a display, print out, or sent electronically to an internal or external system.

Figure 3A:
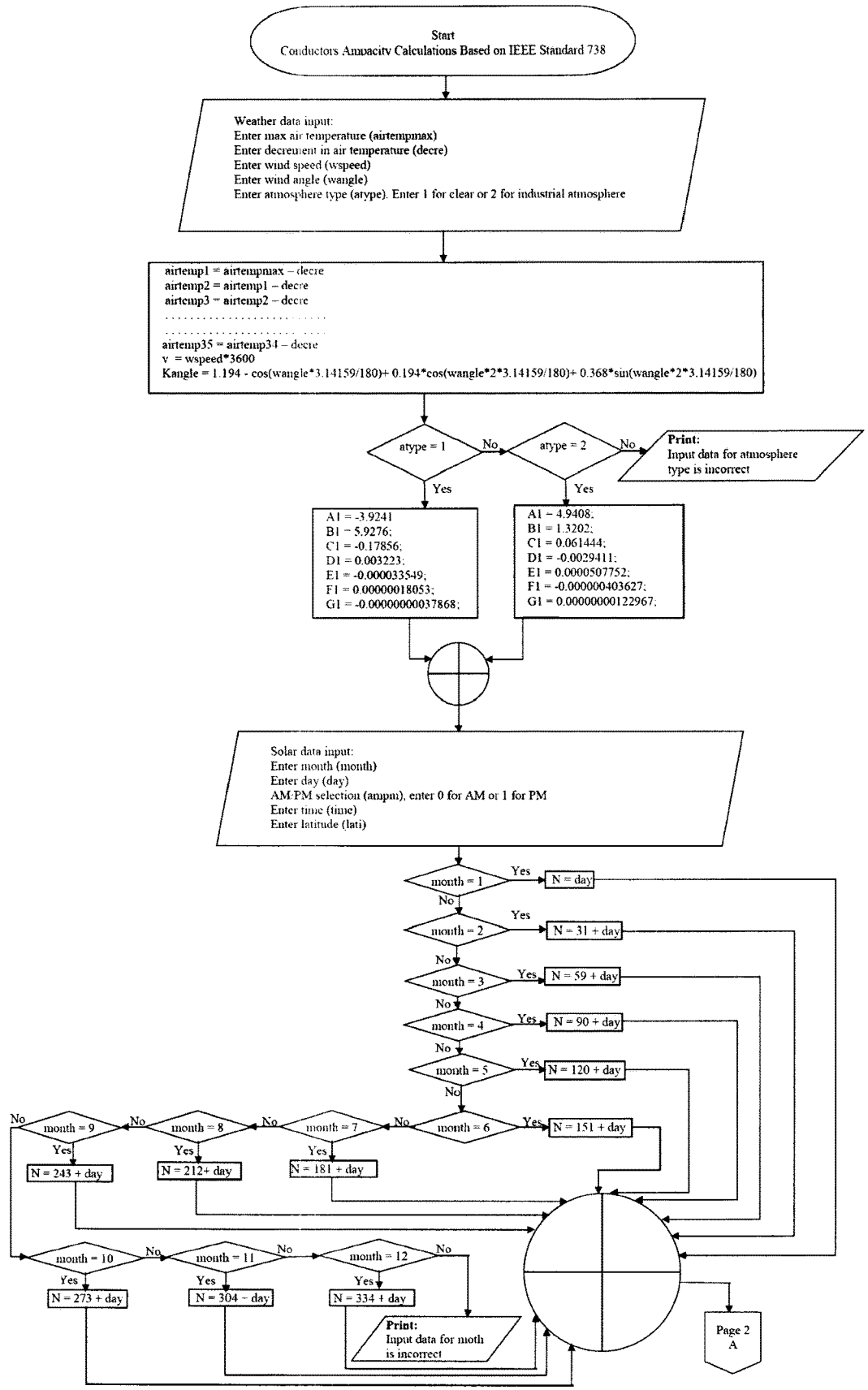
FIGS. 3A-3CC show a flowchart of an example method for computing ampacity of single and multiple conductors in a range of ambient temperatures within a single simulation in accordance with some implementations.
Figure 3B:
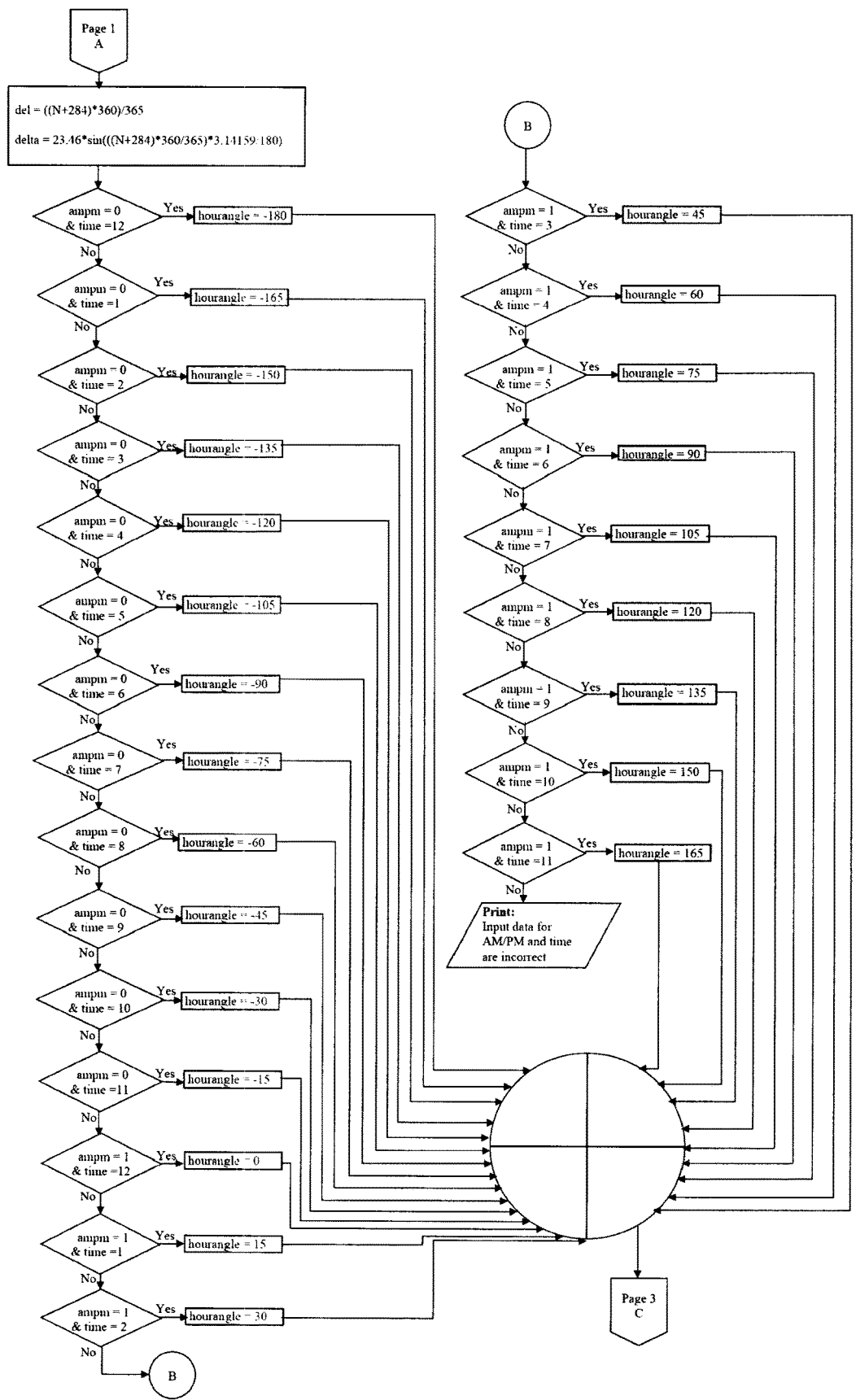
Figure 3C:
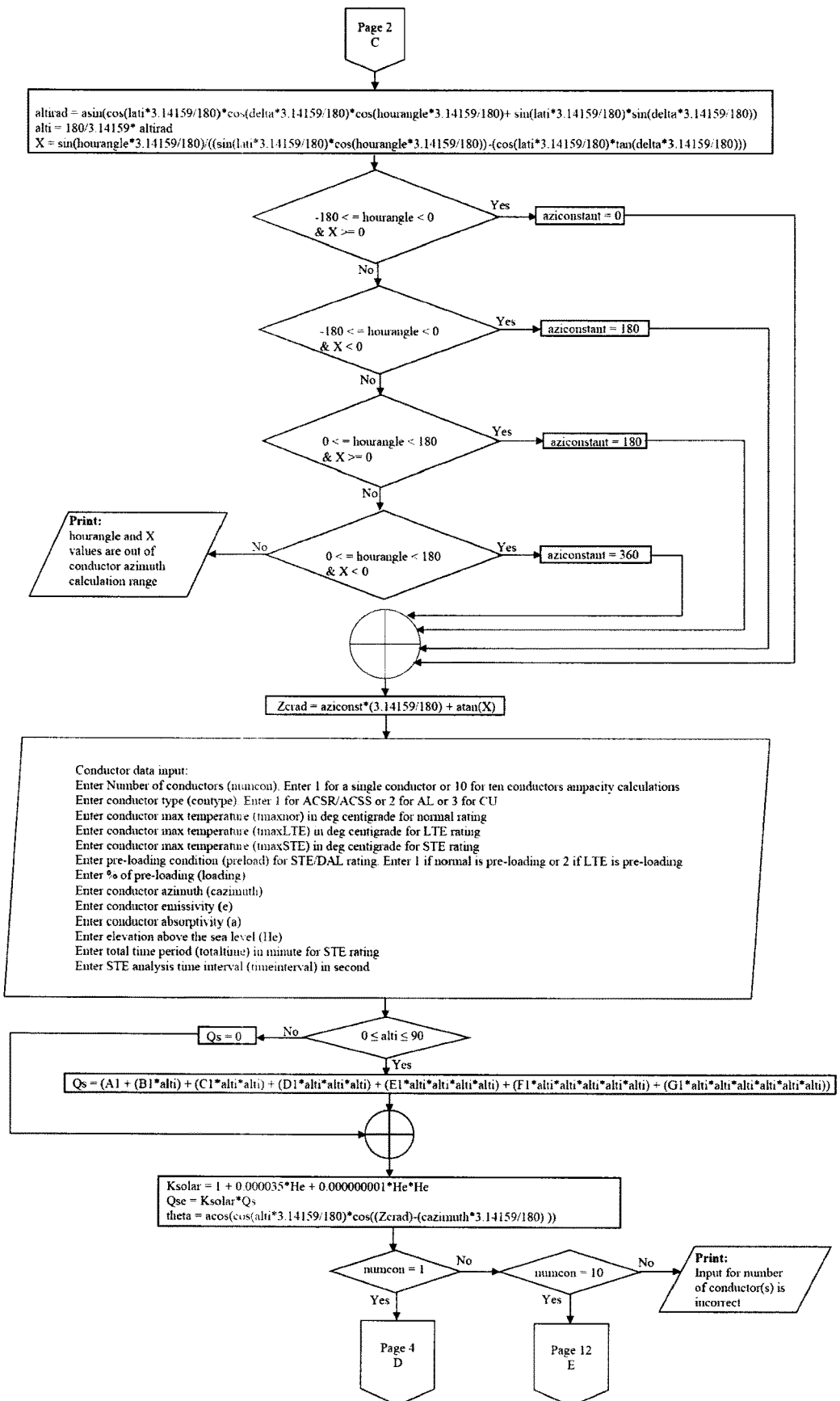
Figure 3D:
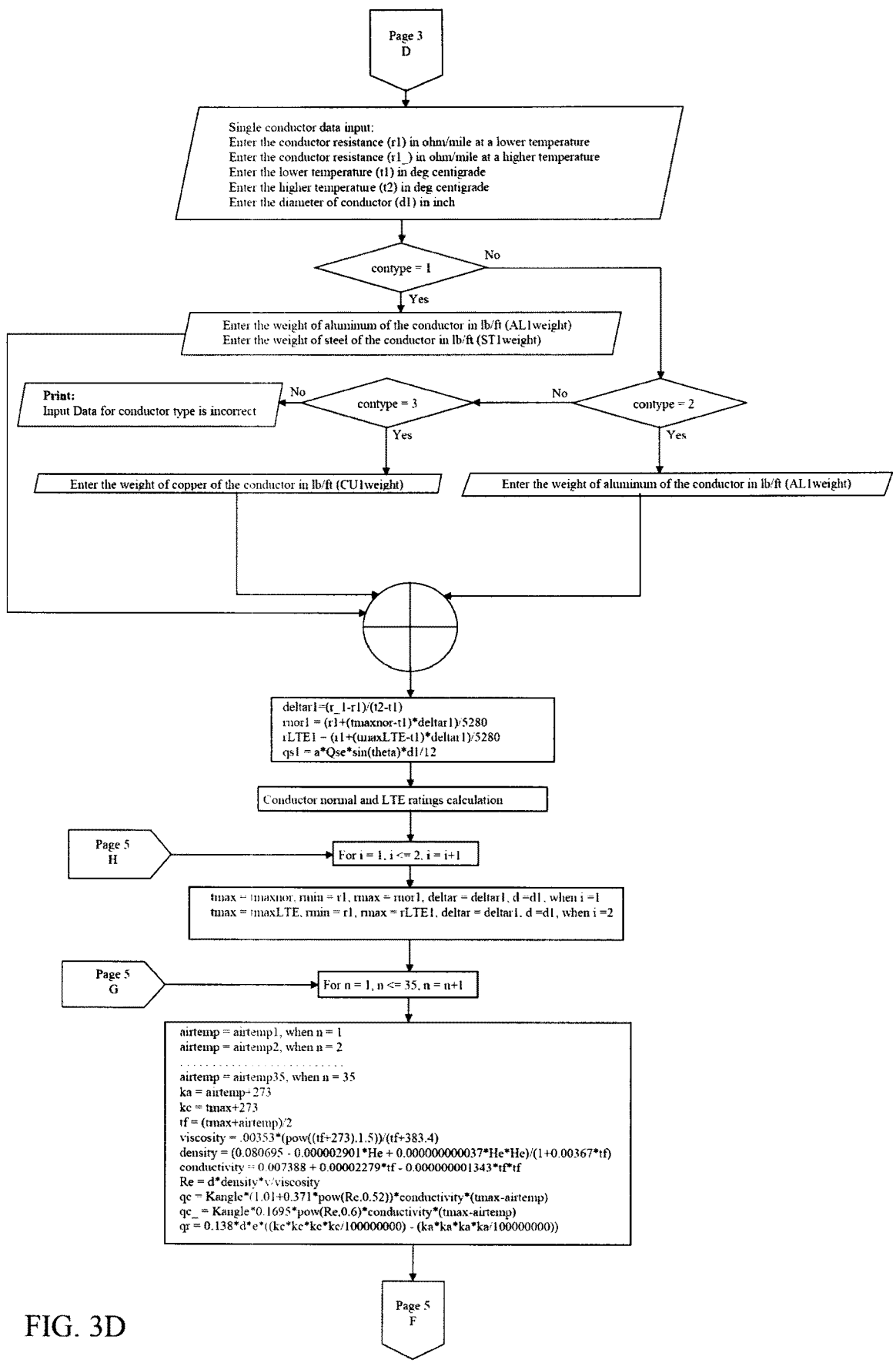
Figure 3E:
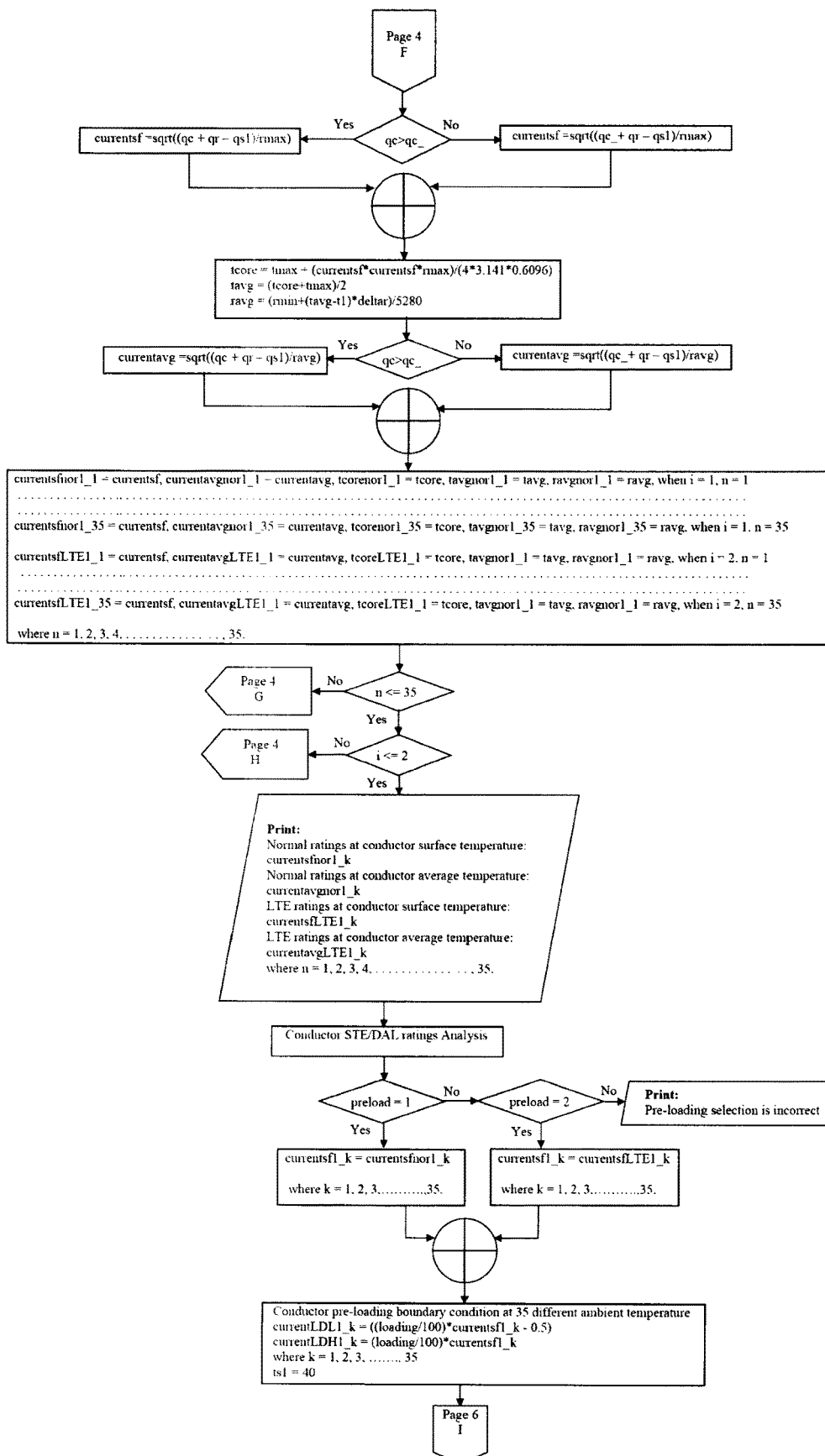
Figure 3F:
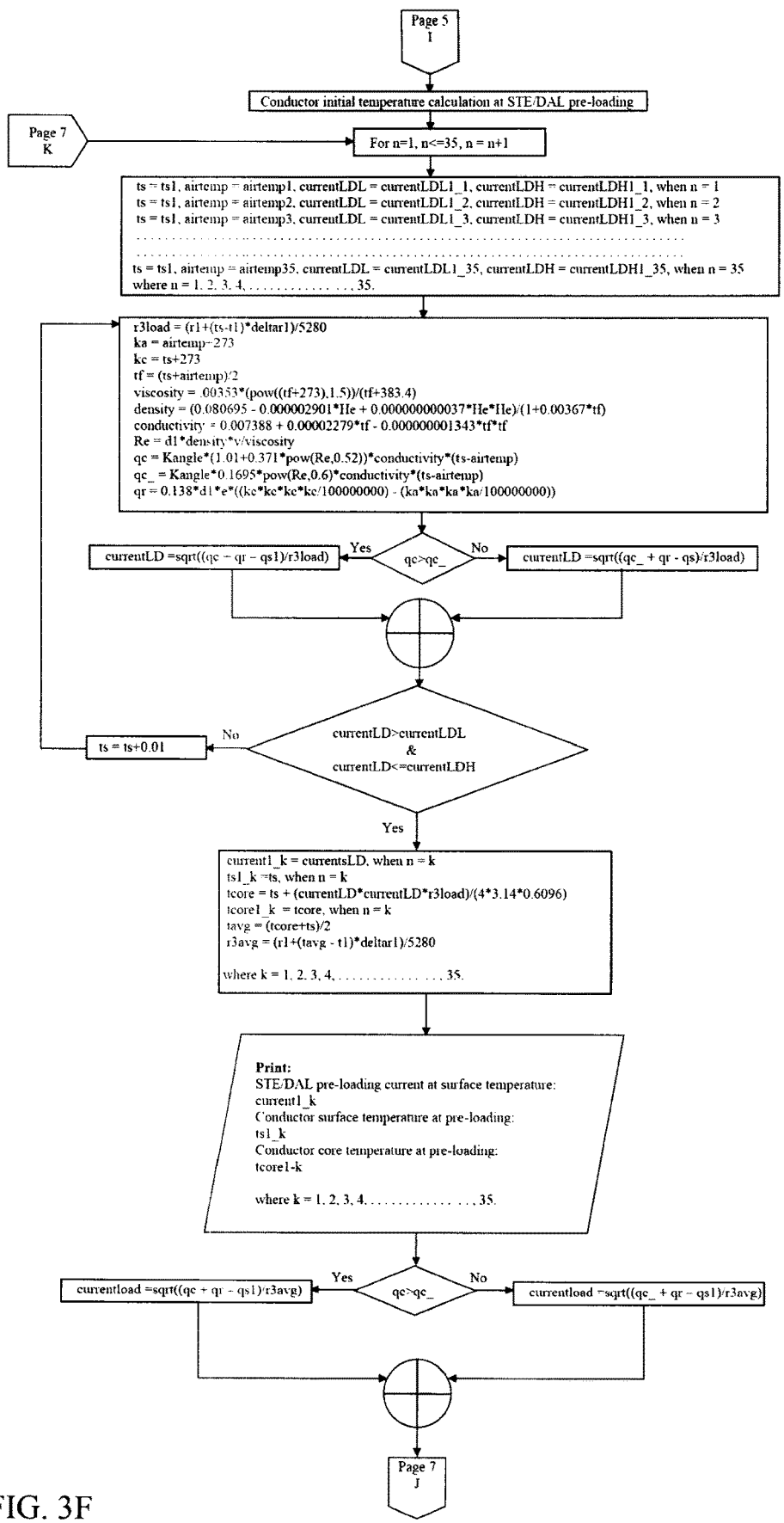
Figure 3G:
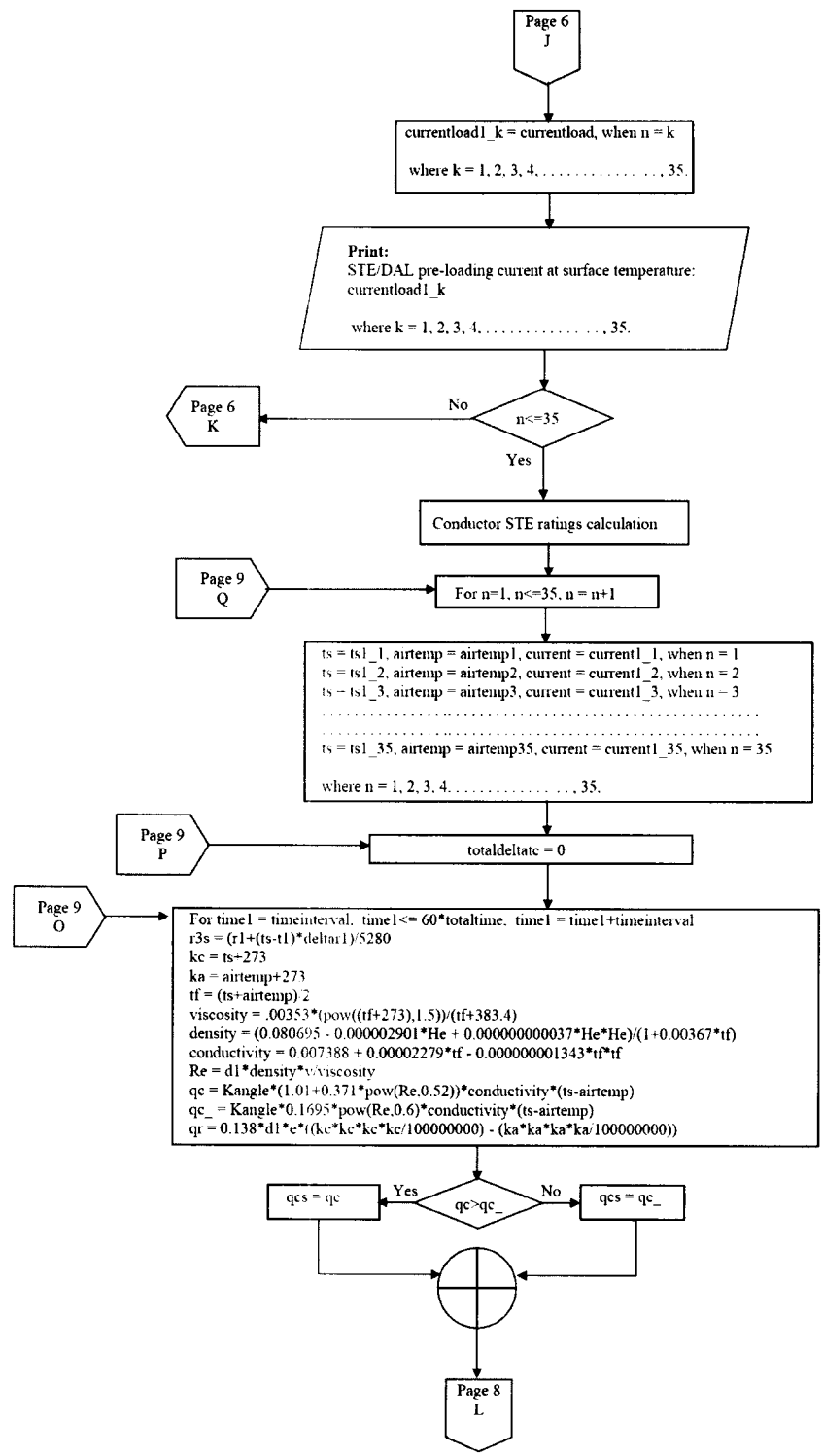
Figure 3H:
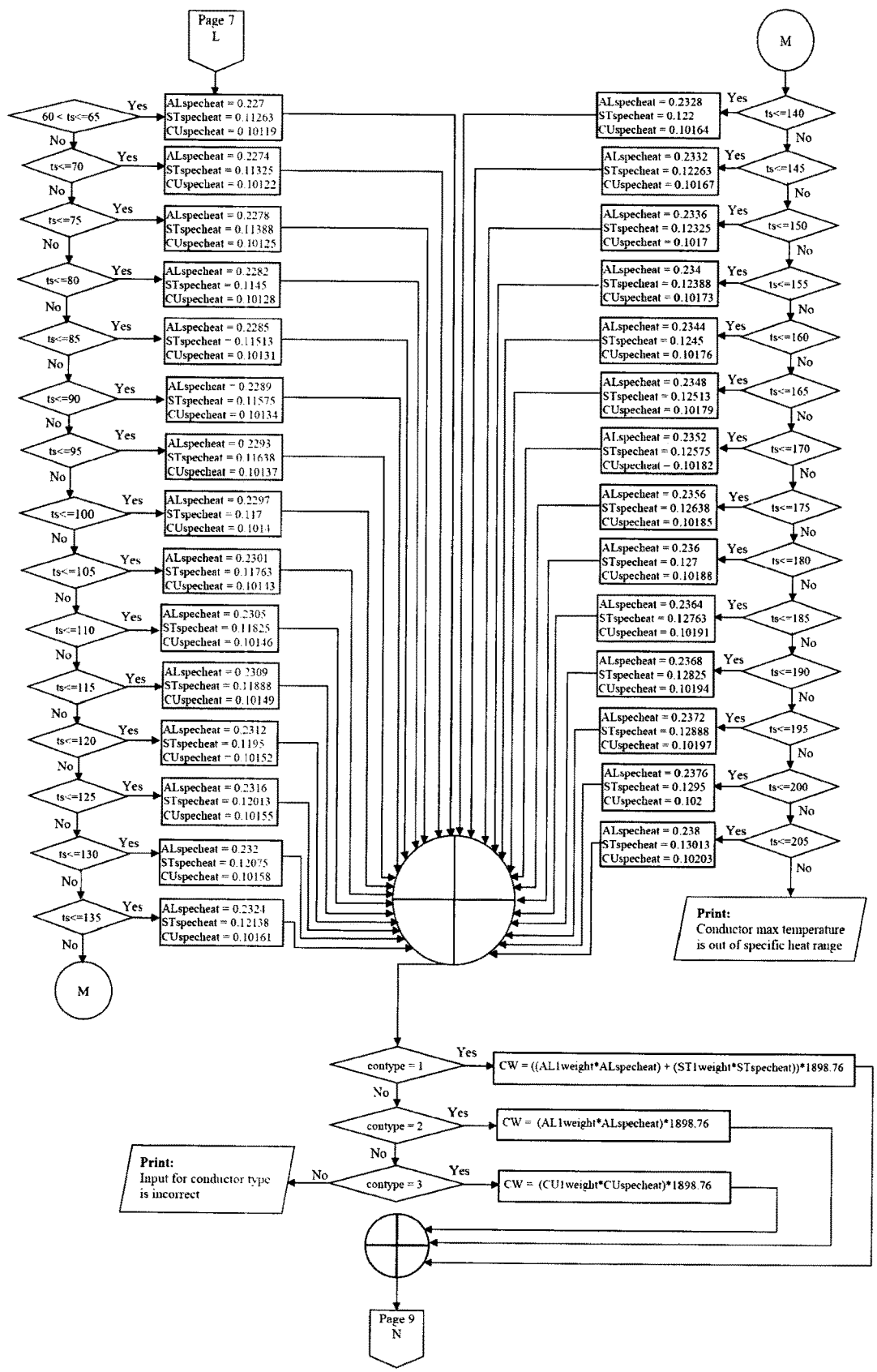
Figure 3I:
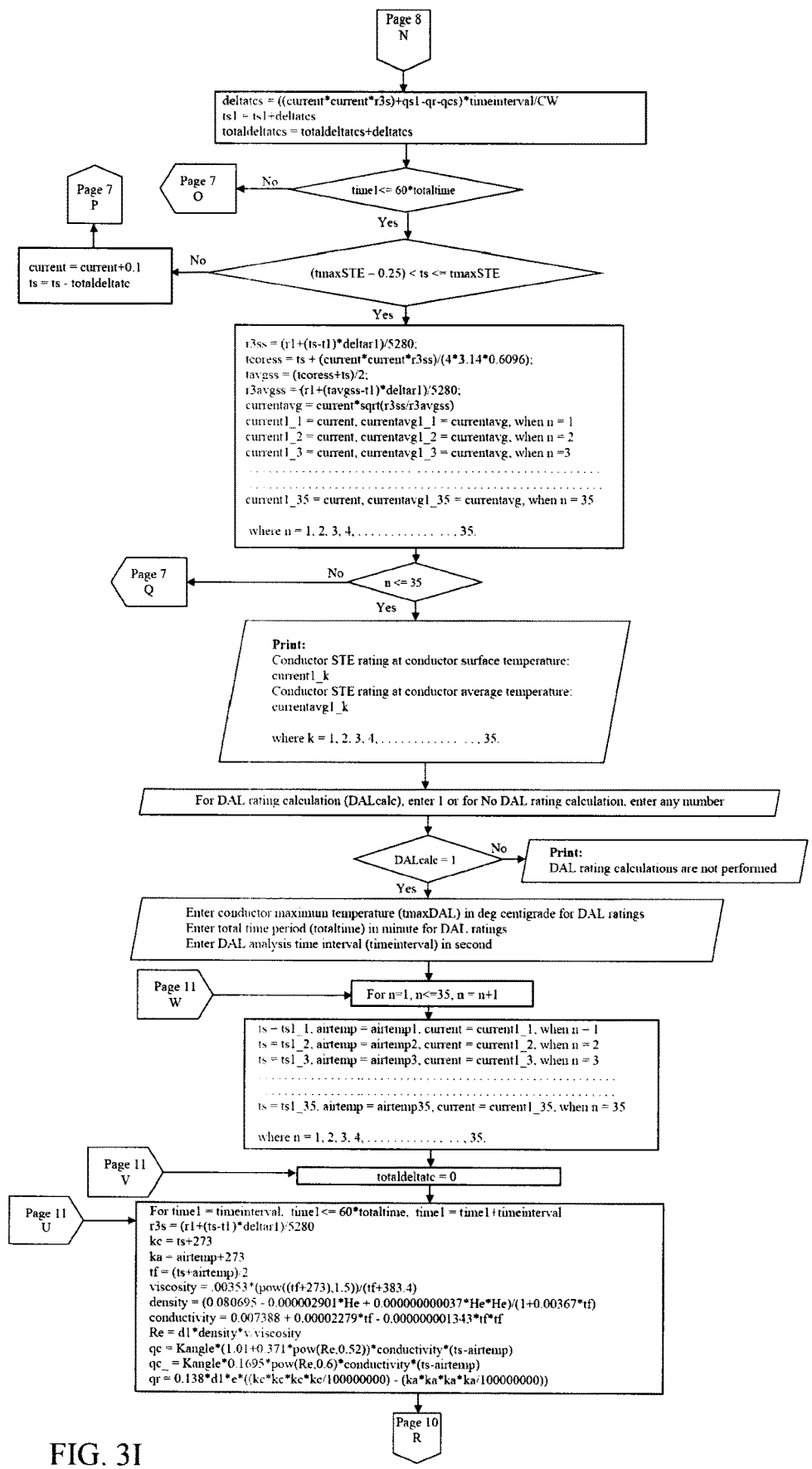
Figure 3J:
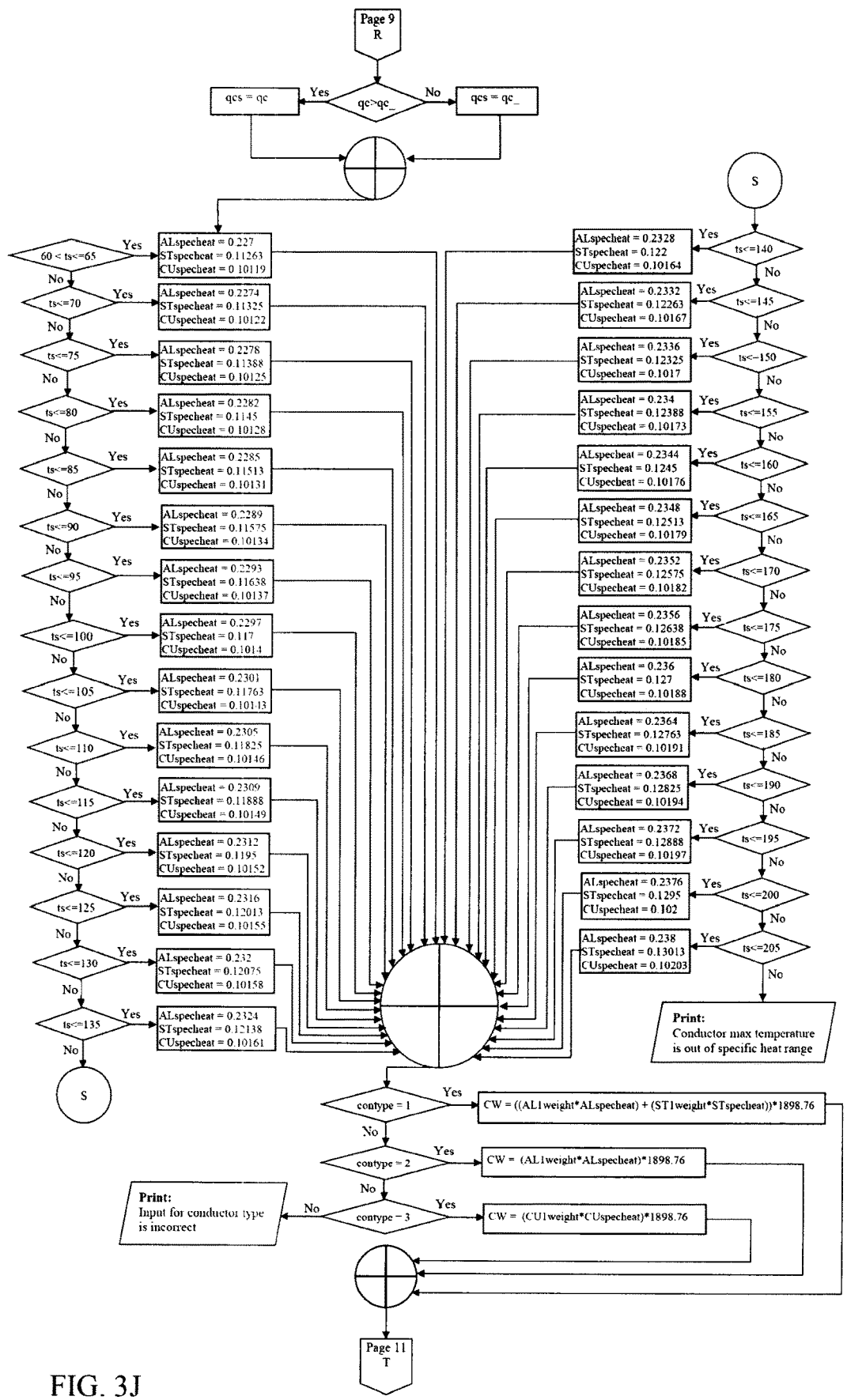
Figure 3K:
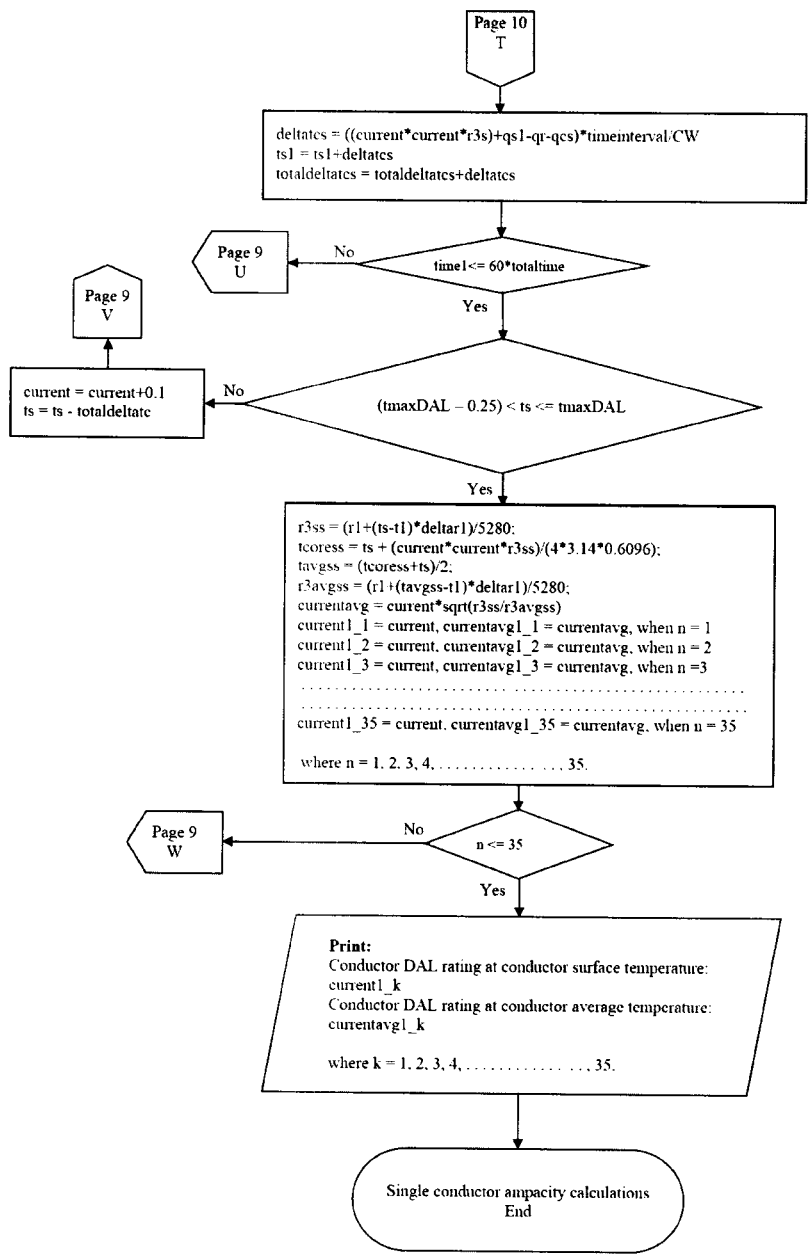
Figure 3L:
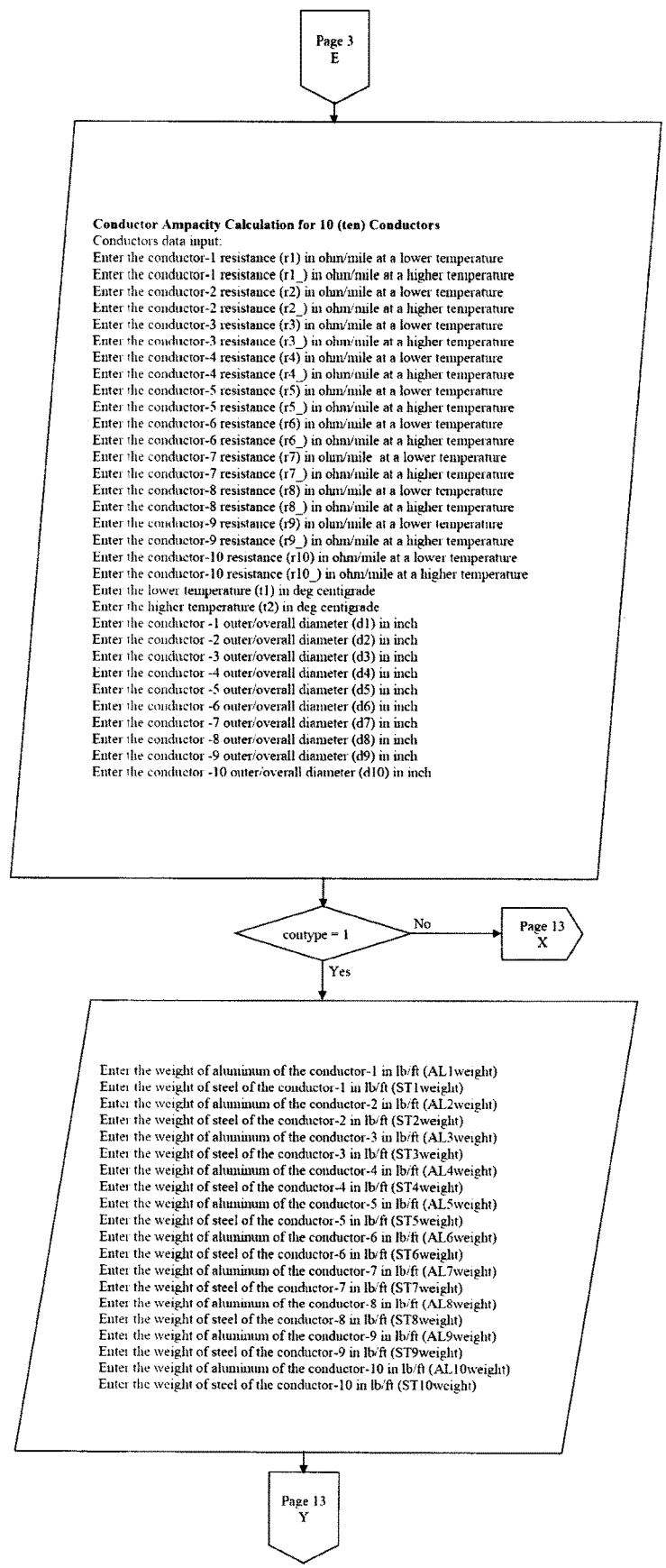
Figure 3M:
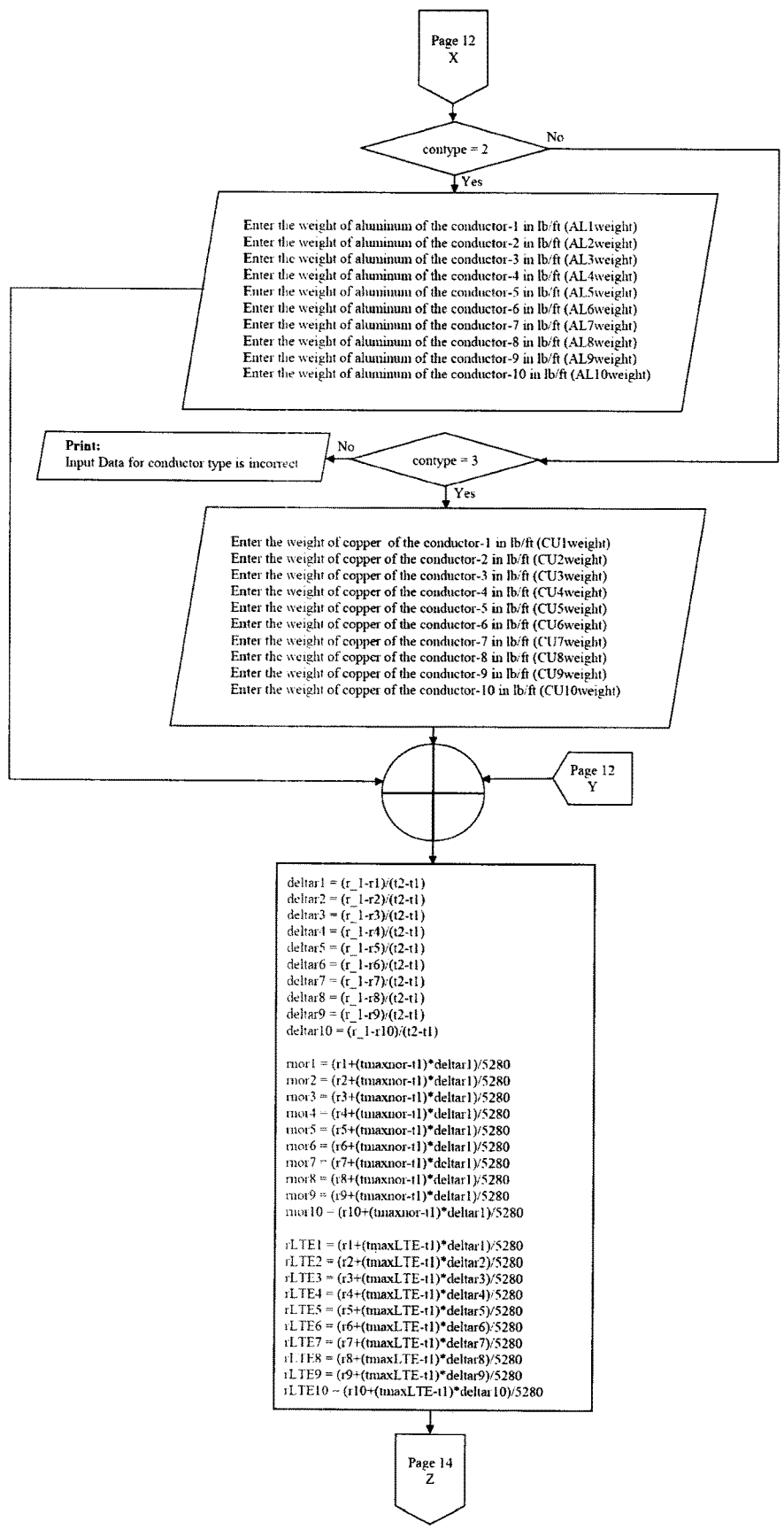
Figure 3N:
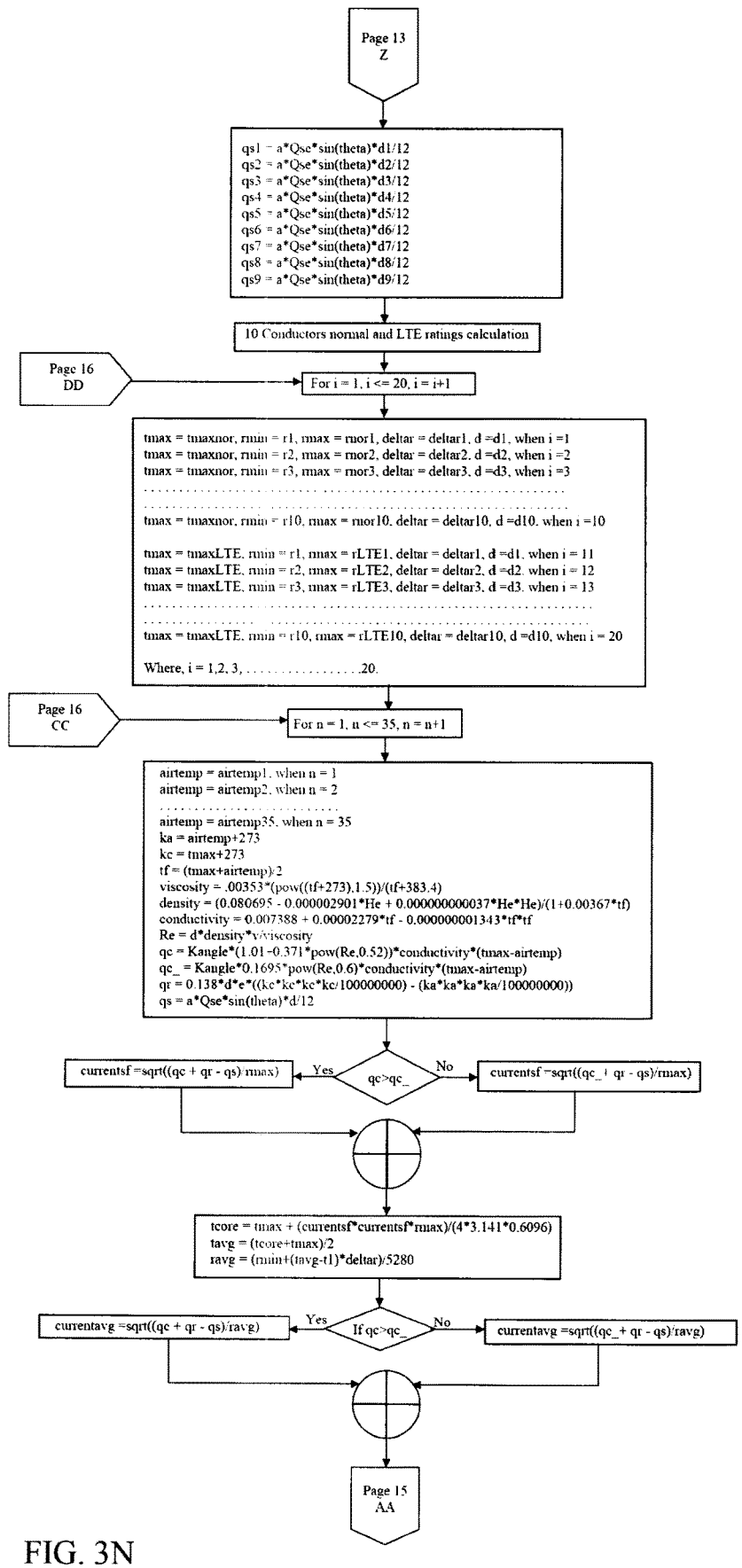
Figure 3Q:
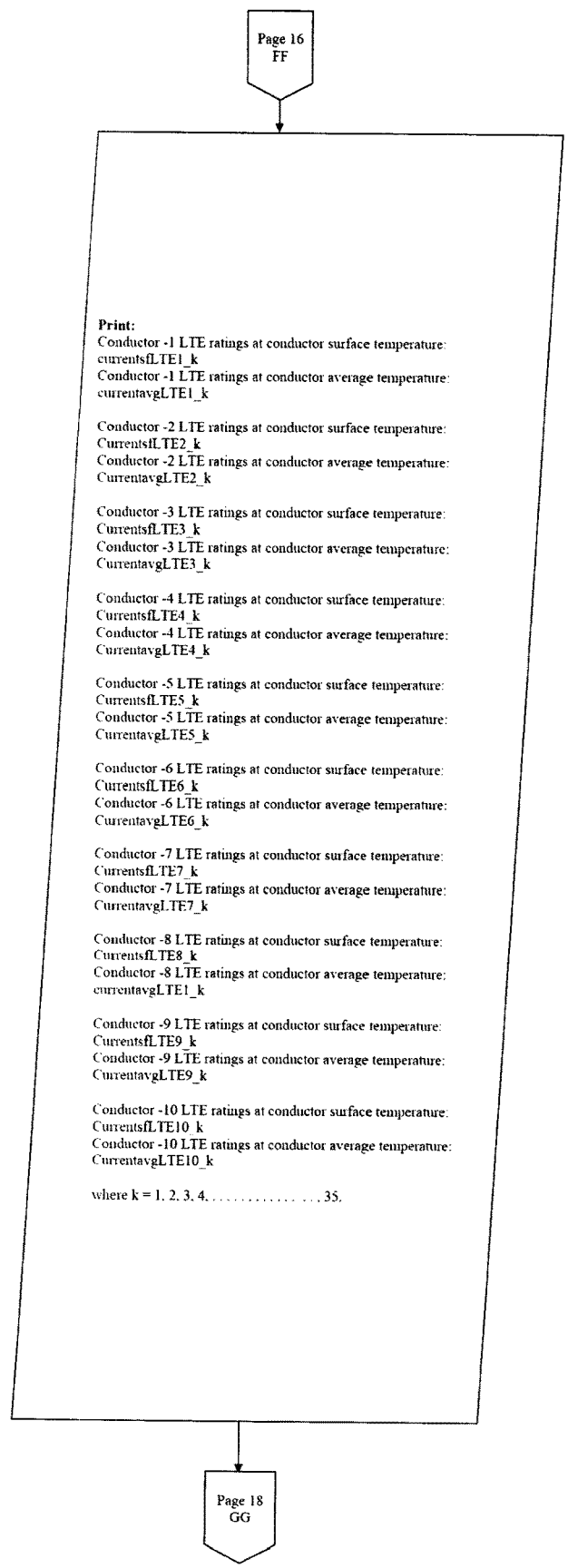
Figure 3R:
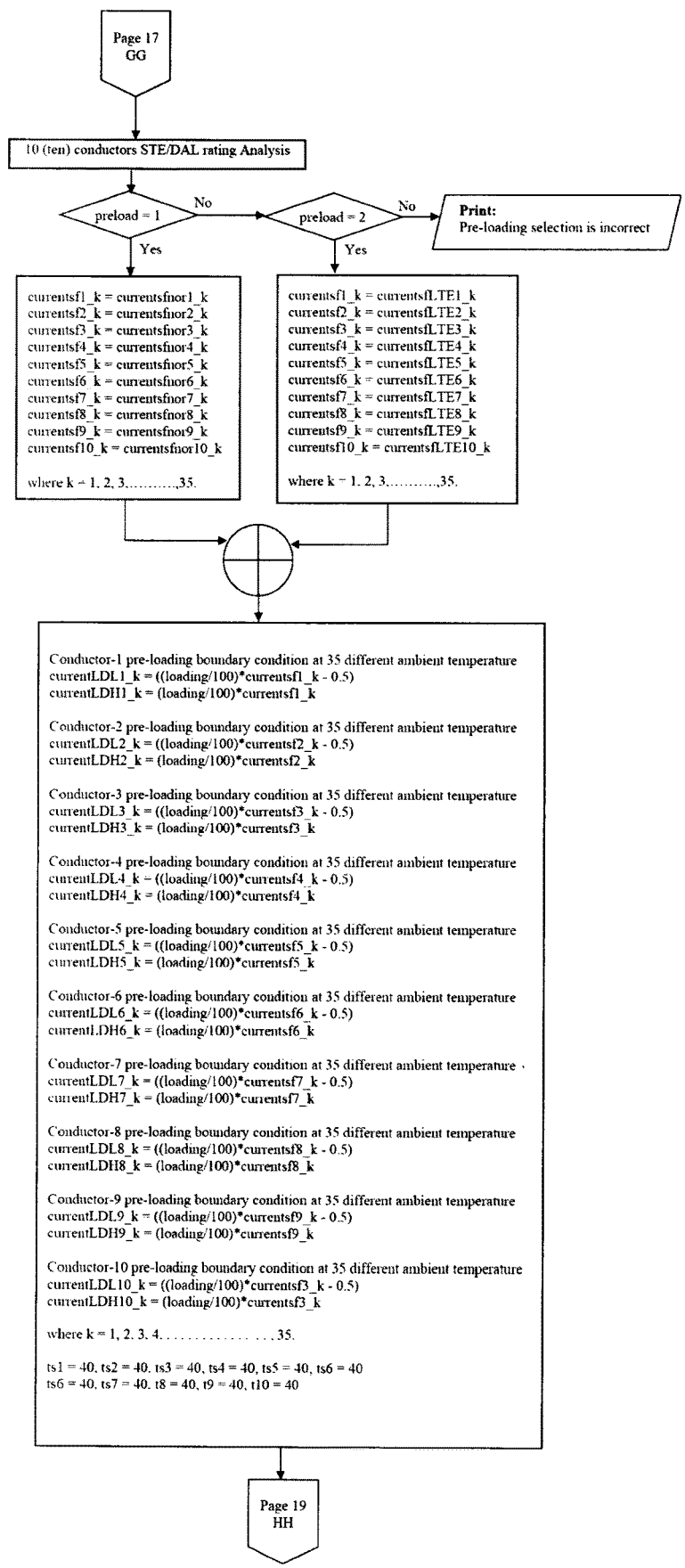
Figure 3S:
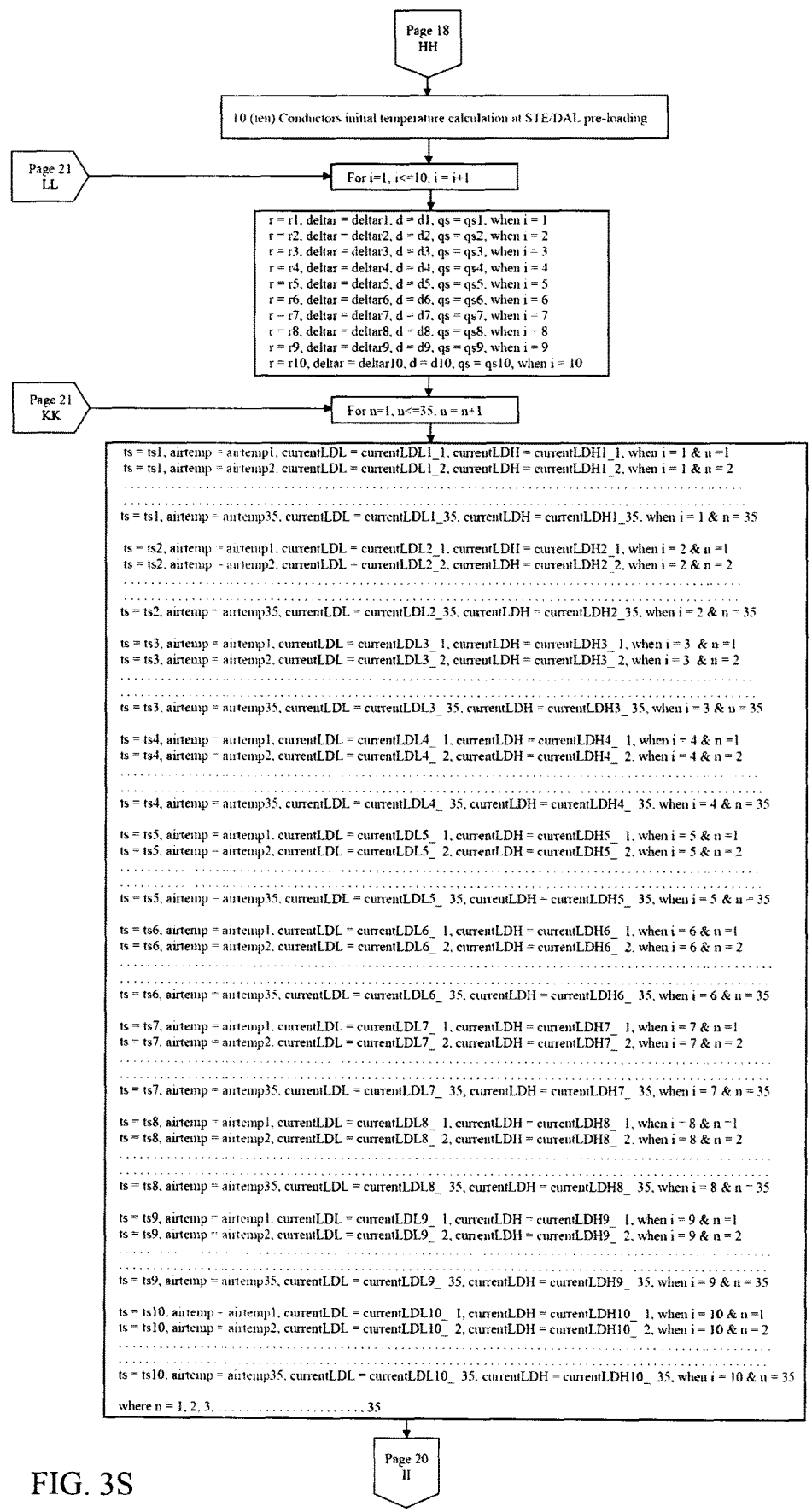
Figure 3T:
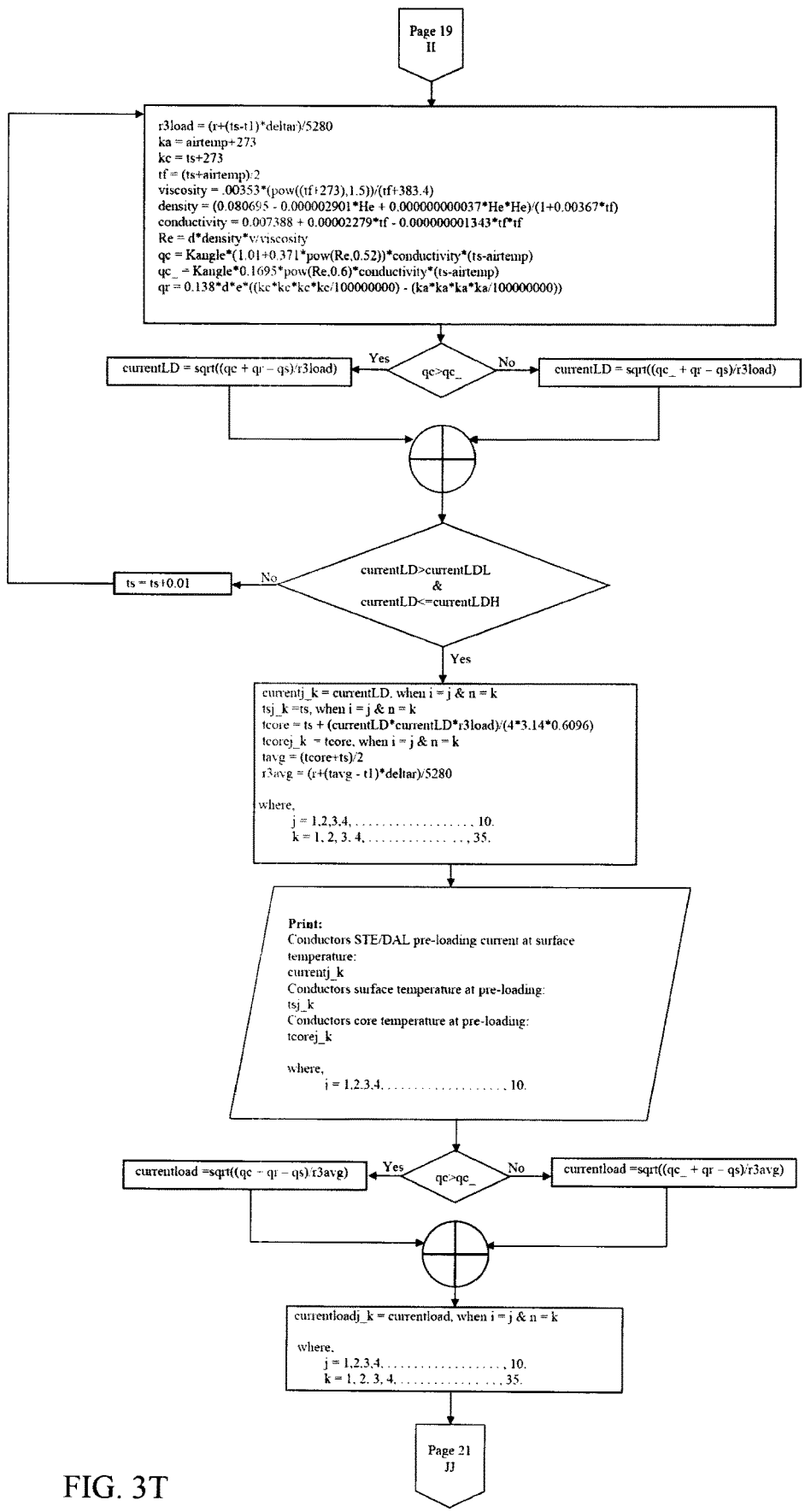
Figure 3U:
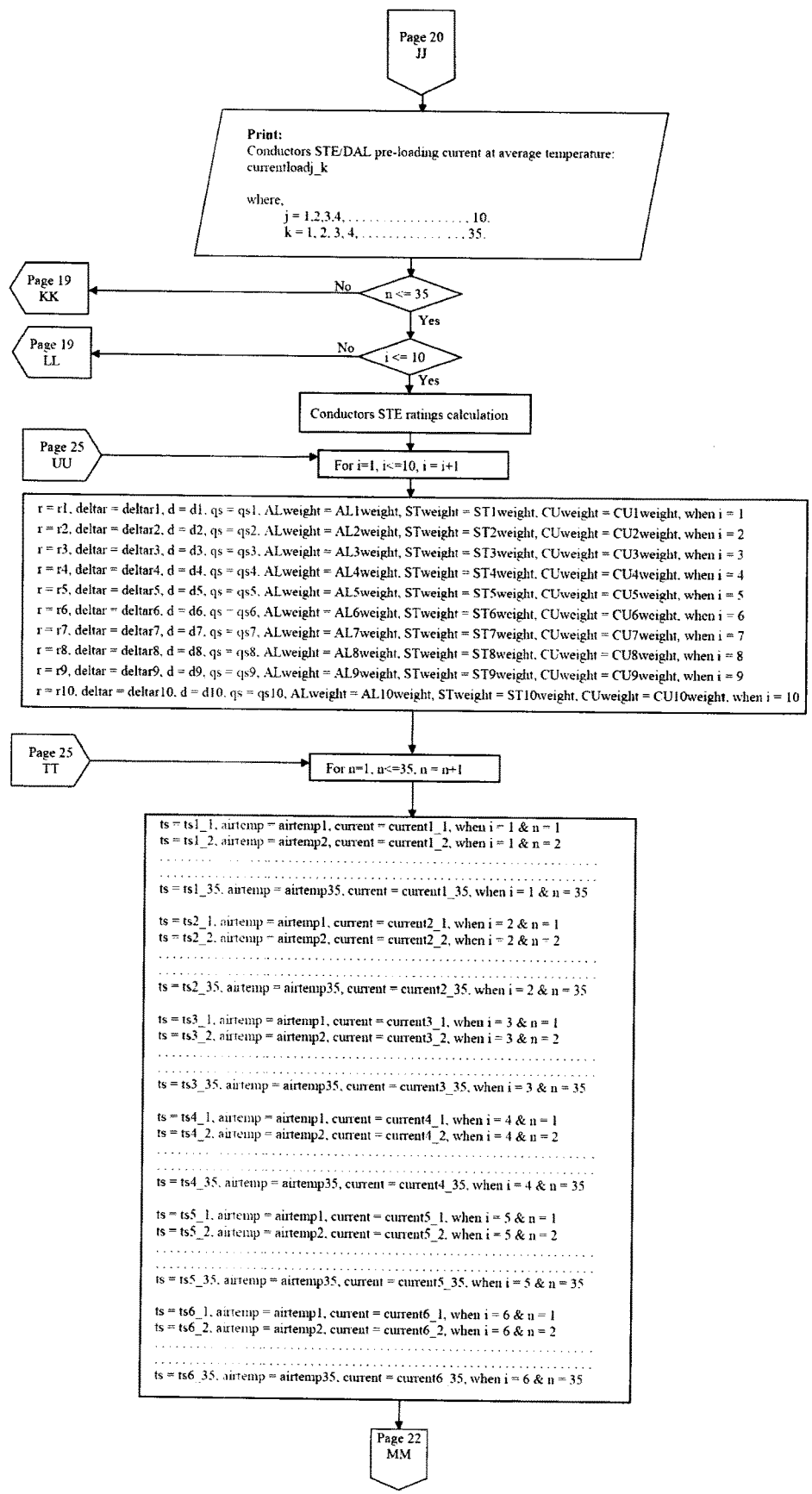
Figure 3V:
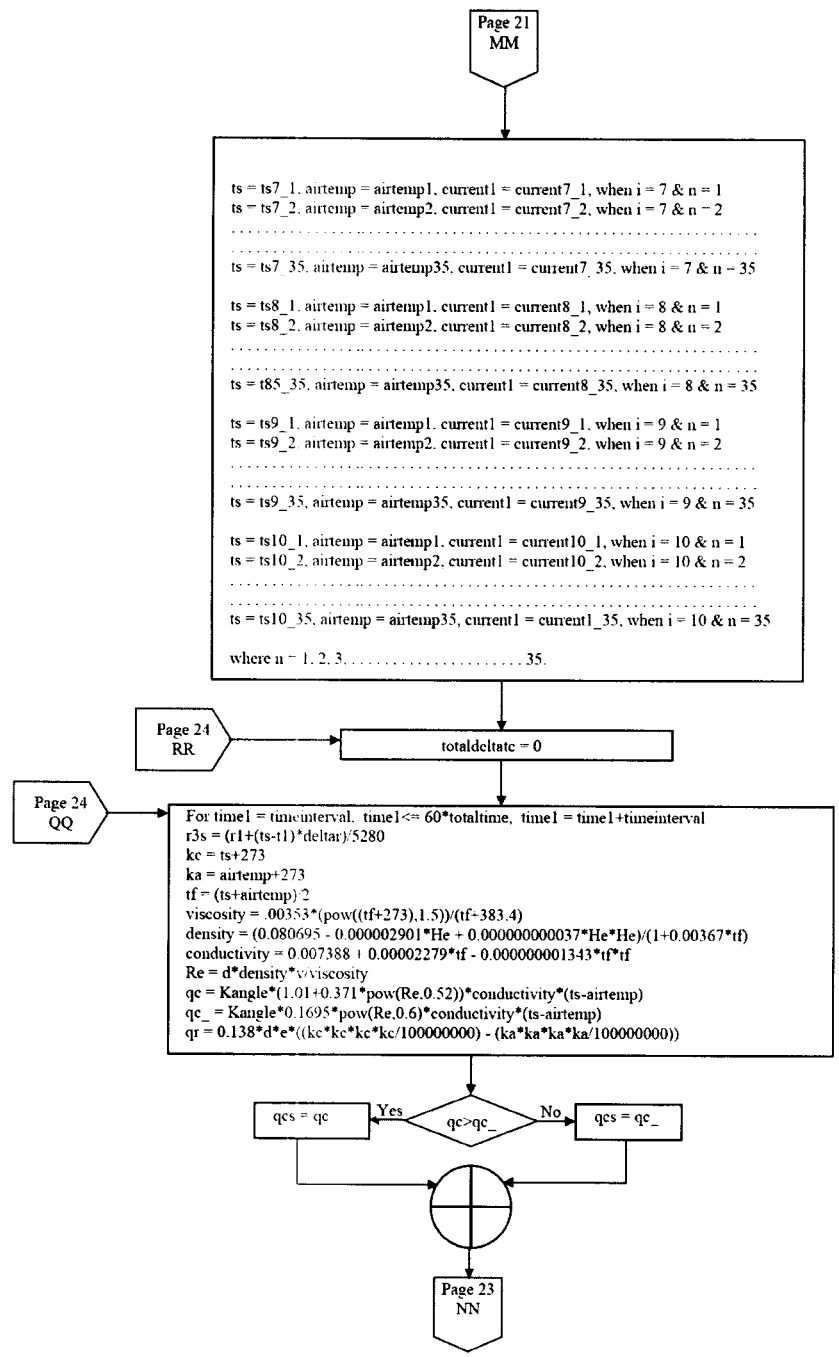
Figure 3W:
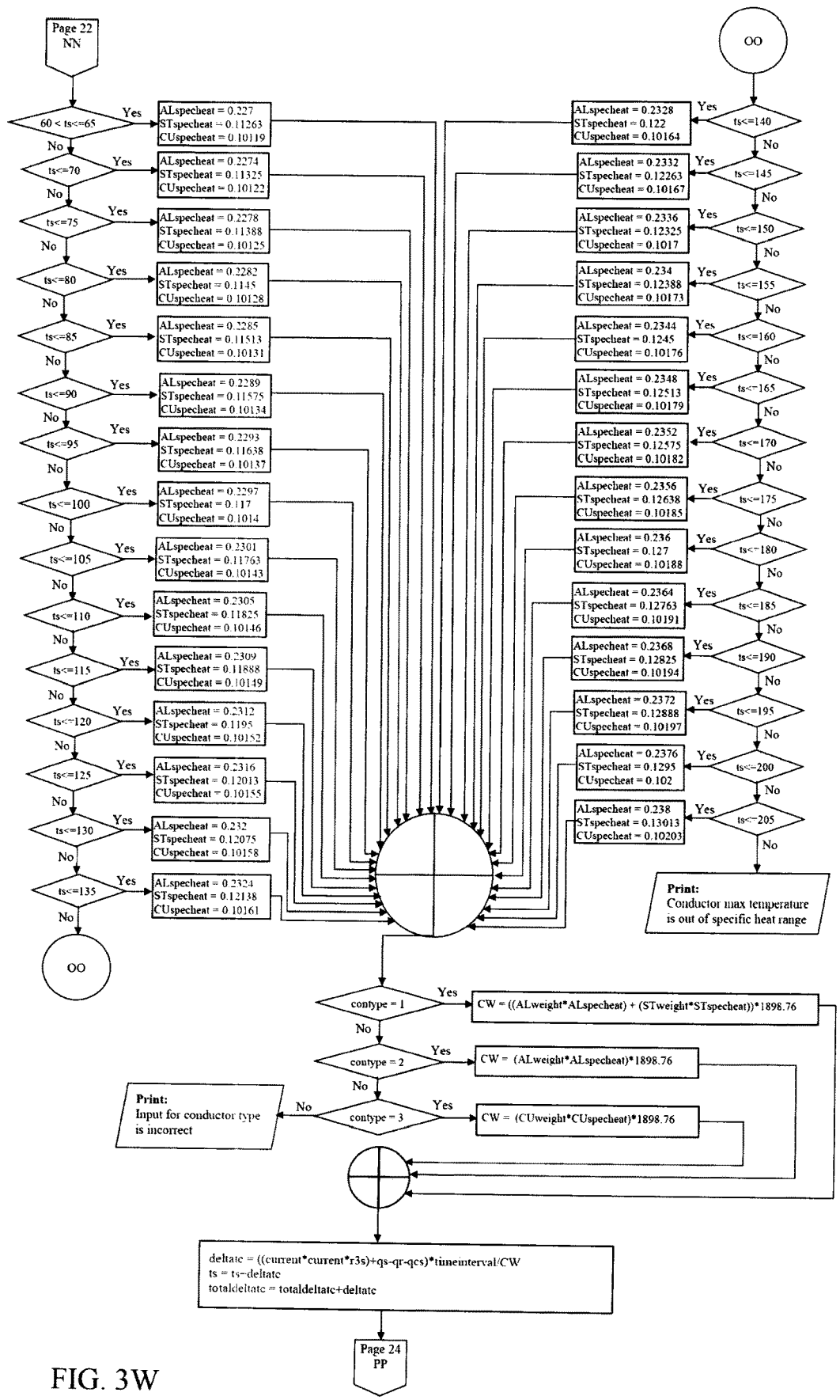
Figure 3X:
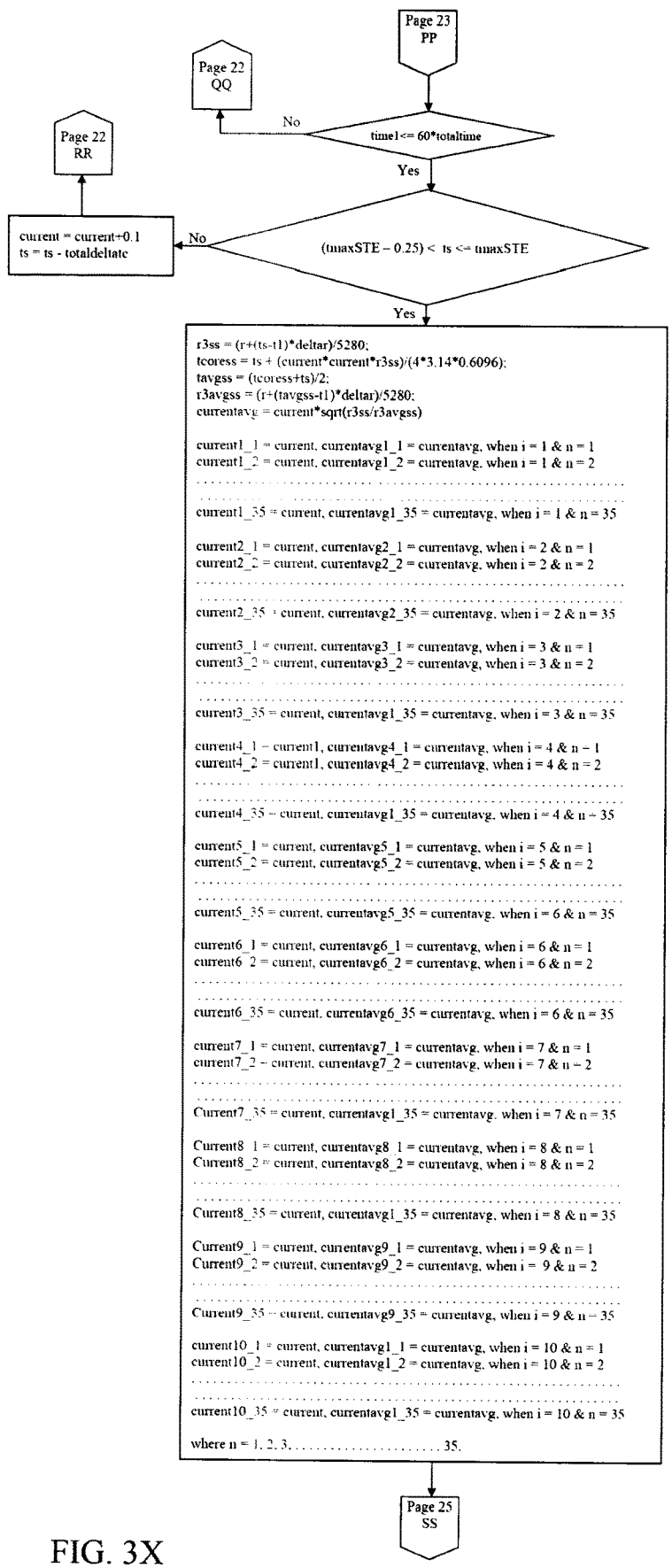
Figure 3Y:
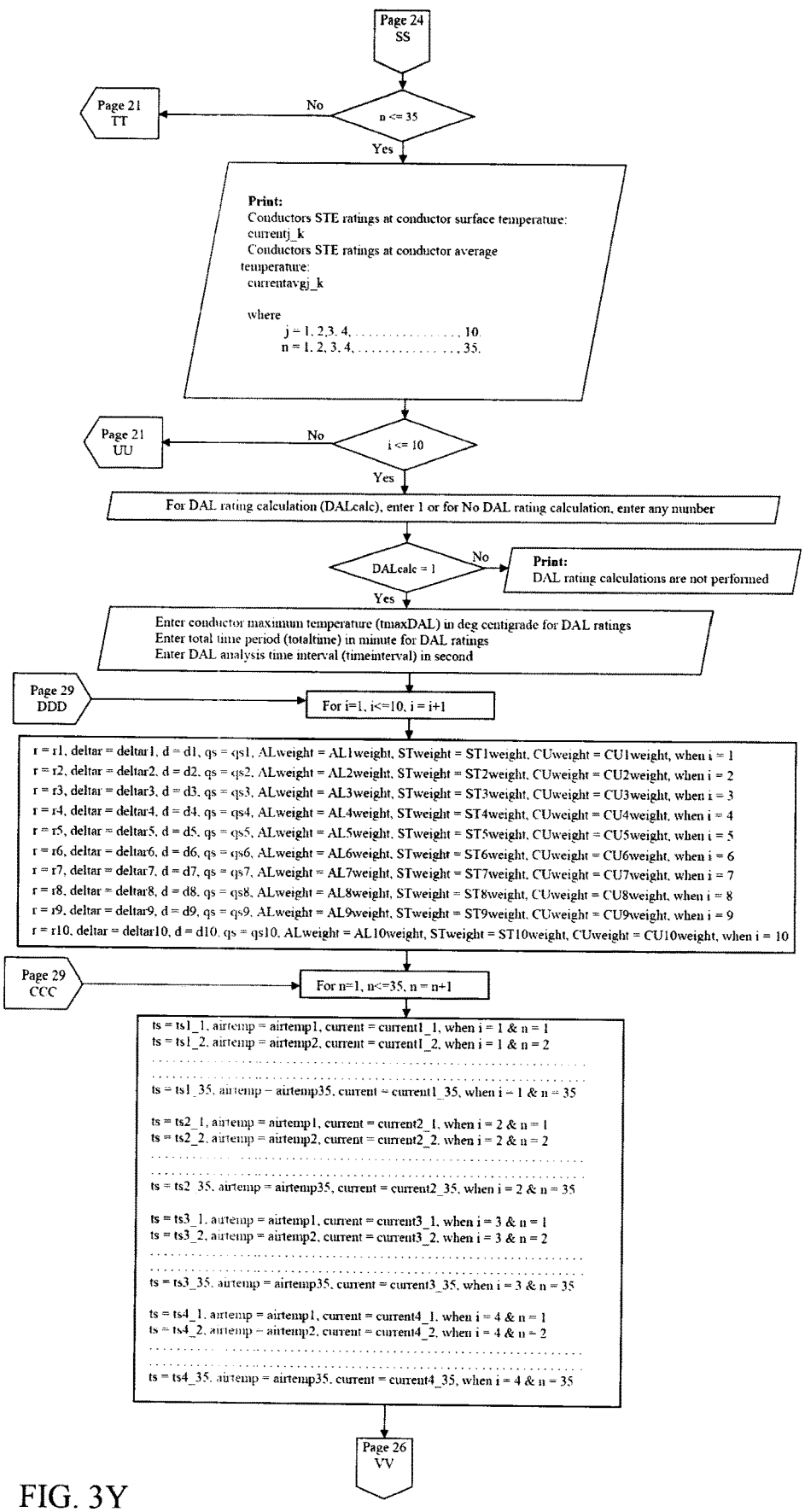
Figure 3Z:
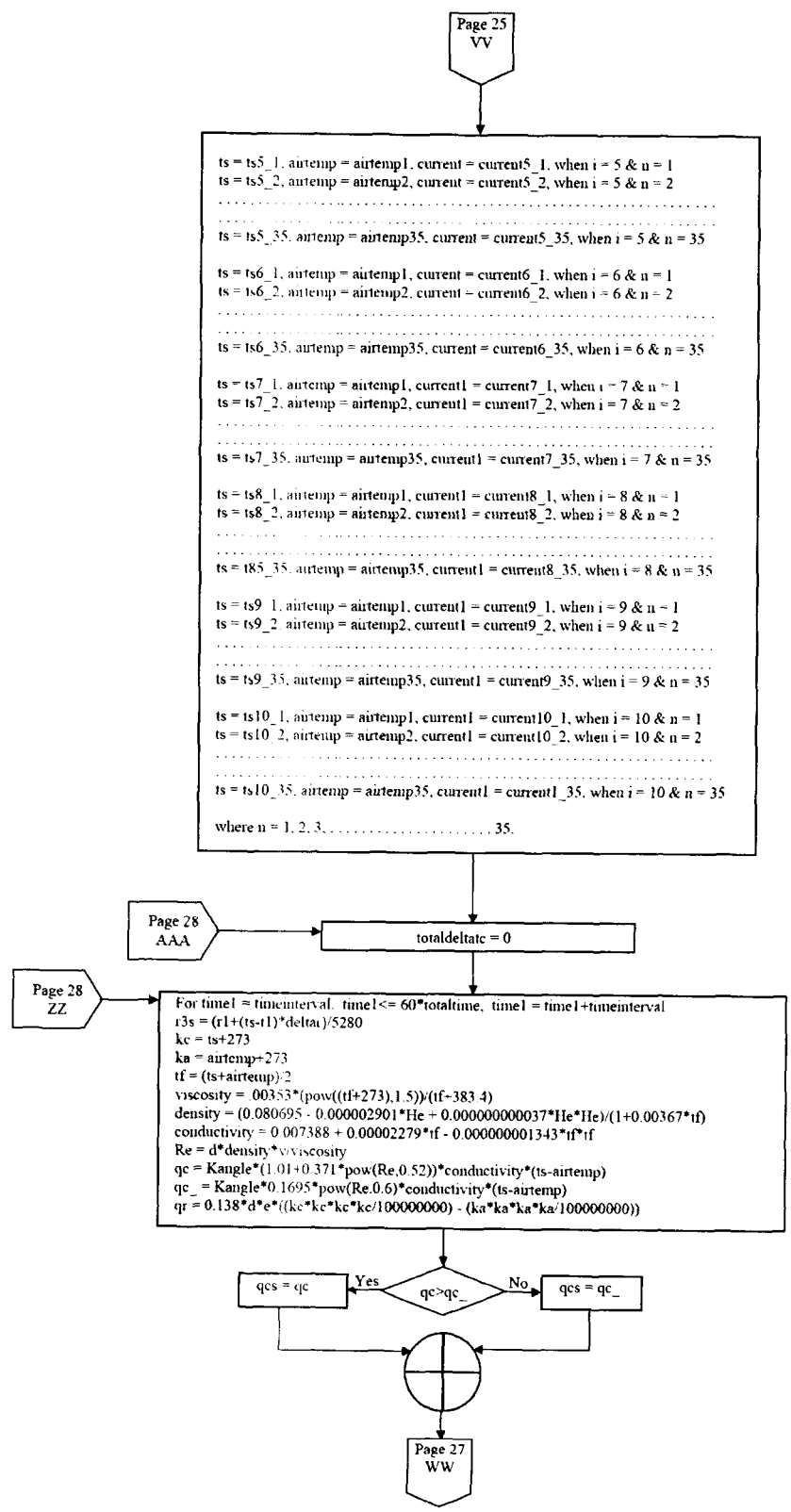
Figure 3A:
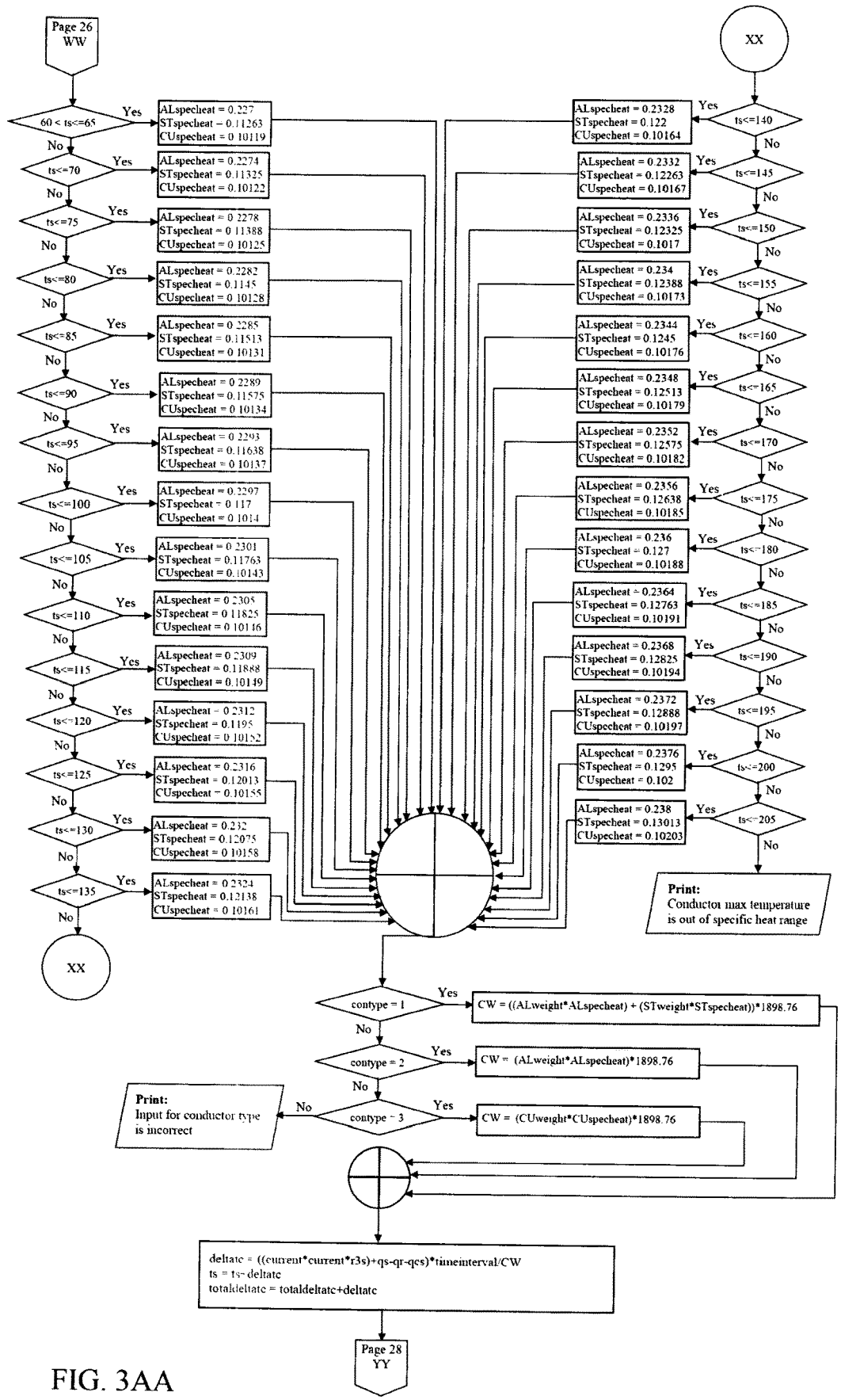
Figure 3B:
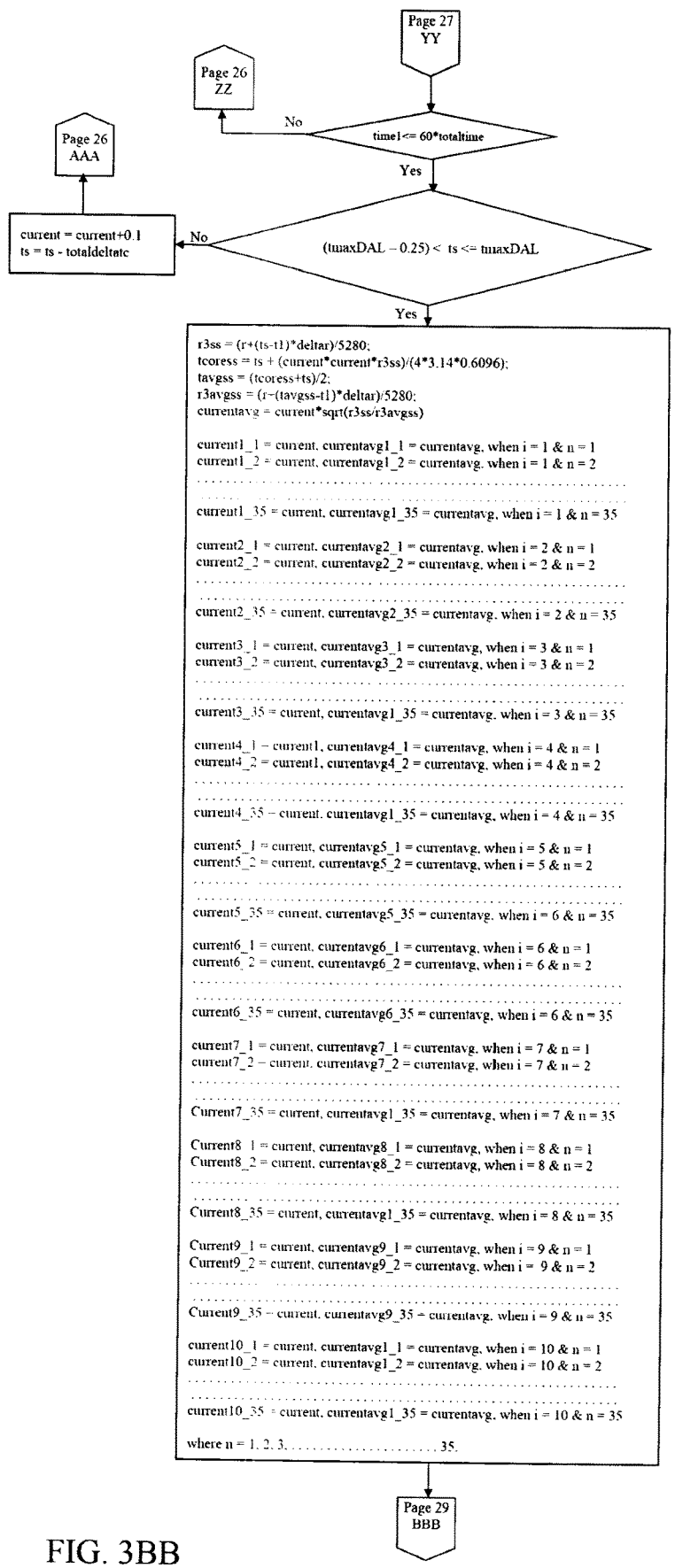
Figure 3C:
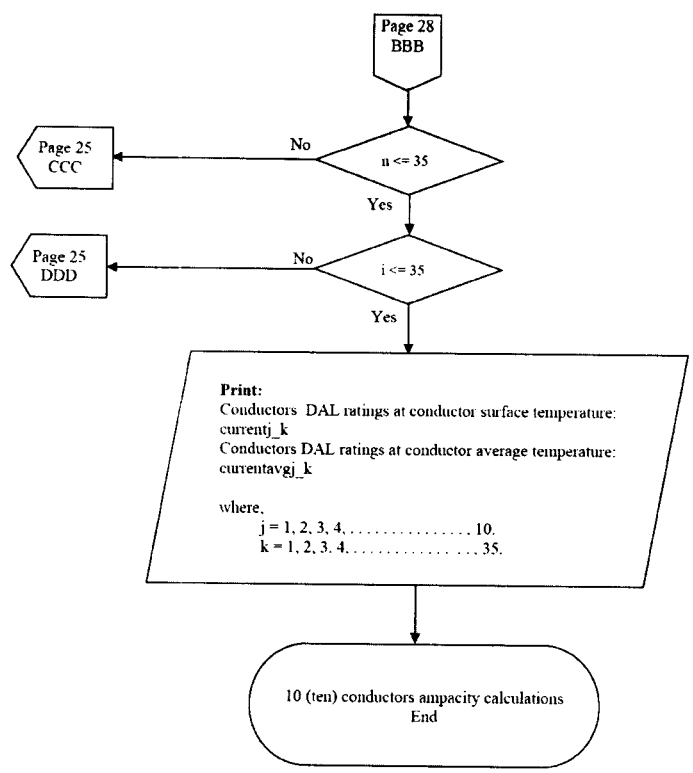

FIGS. 3A-3CC are a flowchart of a detailed method of single or multi-conductor ampacity calculations as shown at a high level in FIG. 2.

Figure 4:
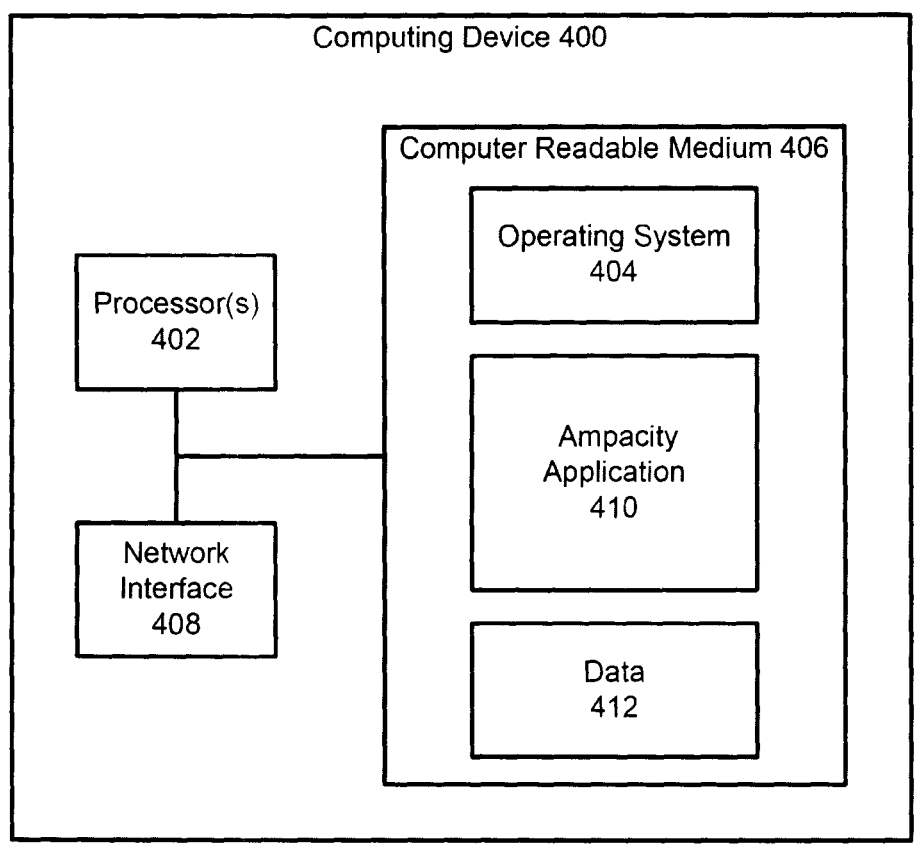
FIG. 4 is a diagram of an example computing device configured for electronic employment document control in accordance with at least one implementation.

FIG. 4 is a diagram of an example computing device 400 in accordance with at least one implementation. The computing device 400 includes one or more processors 402, nontransitory computer readable medium 406 and network interface 408. The computer readable medium 406 can include an operating system 404, an ampacity simulation application 410 for single and multi-strand conductors and a data section 412 (e.g., for storing weather data, solar data, conductor data, etc.).

In operation, the processor 402 may execute the application 410 stored in the computer readable medium 406. The application 410 can include software instructions that, when executed by the processor, cause the processor to perform operations to calculate ampacity in accordance with the present disclosure (e.g., performing associated functions described above and shown in FIG. 2 and FIGS. 3A-3CC).

The application program 410 can operate in conjunction with the data section 412 and the operating system 404.

It will be appreciated that the modules, processes, systems, and sections described above can be implemented in hardware, hardware programmed by software, software instructions stored on a nontransitory computer readable medium or a combination of the above. A system as described above, for example, can include a processor configured to execute a sequence of programmed instructions stored on a nontransitory computer readable medium. For example, the processor can include, but not be limited to, a personal computer or workstation or other such computing system that includes a processor, microprocessor, microcontroller device, or is comprised of control logic including integrated circuits such as, for example, an Application Specific Integrated Circuit (ASIC). The instructions can be compiled from source code instructions provided in accordance with a programming language such as Java, C, C++, C#.net, assembly or the like. The instructions can also comprise code and data objects provided in accordance with, for example, the Visual Basic™ language, or another structured or object-oriented programming language. The sequence of programmed instructions, or programmable logic device configuration software, and data associated therewith can be stored in a nontransitory computer-readable medium such as a computer memory or storage device which may be any suitable memory apparatus, such as, but not limited to ROM, PROM, EEPROM, RAM, flash memory, disk drive and the like.

Furthermore, the modules, processes systems, and sections can be implemented as a single processor or as a distributed processor. Further, it should be appreciated that the steps mentioned above may be performed on a single or distributed processor (single and/or multi-core, or cloud computing system). Also, the processes, system components, modules, and sub-modules described in the various figures of and for embodiments above may be distributed across multiple computers or systems or may be co-located in a single processor or system. Example structural embodiment alternatives suitable for implementing the modules, sections, systems, means, or processes described herein are provided below.

The modules, processors or systems described above can be implemented as a programmed general purpose computer, an electronic device programmed with microcode, a hard-wired analog logic circuit, software stored on a computer-readable medium or signal, an optical computing device, a networked system of electronic and/or optical devices, a special purpose computing device, an integrated circuit device, a semiconductor chip, and/or a software module or object stored on a computer-readable medium or signal, for example.

Embodiments of the method and system (or their subcomponents or modules), may be implemented on a general-purpose computer, a special-purpose computer, a programmed microprocessor or microcontroller and peripheral integrated circuit element, an ASIC or other integrated circuit, a digital signal processor, a hardwired electronic or logic circuit such as a discrete element circuit, a programmed logic circuit such as a PLD, PLA, FPGA, PAL, or the like. In general, any processor capable of implementing the functions or steps described herein can be used to implement embodiments of the method, system, or a computer program product (software program stored on a nontransitory computer readable medium).

Furthermore, embodiments of the disclosed method, system, and computer program product (or software instructions stored on a nontransitory computer readable medium) may be readily implemented, fully or partially, in software using, for example, object or object-oriented software development environments that provide portable source code that can be used on a variety of computer platforms. Alternatively, embodiments of the disclosed method, system, and computer program product can be implemented partially or fully in hardware using, for example, standard logic circuits or a VLSI design. Other hardware or software can be used to implement embodiments depending on the speed and/or efficiency requirements of the systems, the particular function, and/or particular software or hardware system, microprocessor, or microcomputer being utilized. Embodiments of the method, system, and computer program product can be implemented in hardware and/or software using any known or later developed systems or structures, devices and/or software by those of ordinary skill in the applicable art from the function description provided herein and with a general basic knowledge of the software engineering and computer networking arts.

Moreover, embodiments of the disclosed method, system, and computer readable media (or computer program product) can be implemented in software executed on a programmed general-purpose computer, a special purpose computer, a microprocessor, a network server or switch, or the like.

It is, therefore, apparent that there is provided, in accordance with the various embodiments disclosed herein, methods, systems and computer readable media to calculate ampacity of single and multiple conductors across a temperature range.

While the disclosed subject matter has been described in conjunction with a number of embodiments, it is evident that many alternatives, modifications and variations would be, or are, apparent to those of ordinary skill in the applicable arts. Accordingly, Applicant intends to embrace all such alternatives, modifications, equivalents and variations that are within the spirit and scope of the disclosed subject matter.

What is claimed is:

1. A method comprising:
receiving, at one or more processors, weather data;
receiving, at the one or more processors, solar data;
receiving, at the one or more processors, conductor data;

receiving, at the one or more processors, a temperature decrement;

programmatically simulating, using the one or more processors, ampacity for normal operating conditions across a temperature range, wherein the temperature range includes a number of temperatures from a first temperature to a second temperature in a given interval between successive pairs of temperatures, wherein the given interval between the successive pairs of temperatures equals the temperature decrement received at the one or more processors;

programmatically simulating, using the one or more processors, ampacity for long term emergency (LTE) operating conditions across the temperature range;

programmatically simulating, using the one or more processors, ampacity for short term emergency (STE) operating conditions across the temperature range; and programmatically simulating, using the one or more processors, ampacity for drastic action limit (DAL) operating conditions across the temperature range, wherein the method is performed within a single simulation.

2. The method of claim 1, wherein the conductor data includes data representing a plurality of conductors.

3. The method of claim 2, wherein the programmatically simulating ampacity for normal operating conditions, the programmatically simulating ampacity for LTE operating conditions, programmatically simulating ampacity for STE operating conditions, and programmatically simulating ampacity for DAL operating conditions are performed for each conductor of the plurality of conductors across the temperature range.

4. The method of claim 3, wherein each of the programmatically simulating ampacity for normal operating conditions, the programmatically simulating ampacity for LTE operating conditions, programmatically simulating ampacity for STE operating conditions, and programmatically simulating ampacity for DAL operating conditions, includes applying both a first technique and a second technique, wherein the first technique includes conductor surface temperature, and the second technique includes an average temperature of conductor surface and core temperatures.

5. The method of claim 4, wherein the first technique meets IEEE Standard 738-2006.

6. The method of claim 4, wherein the second technique meets IEEE Standard 738-2012.

7. The method of claim 4, further comprising generating a lookup table containing results of the programmatically simulating ampacity for normal operating conditions, the programmatically simulating ampacity for LTE operating conditions, programmatically simulating ampacity for STE operating conditions, and programmatically simulating ampacity for DAL operating conditions.

8. A system comprising:
a processor coupled to a nontransitory computer readable medium having stored thereon software instructions that, when executed by the processor, cause the processor to perform operations including:
receiving, at one or more processors, weather data;
receiving, at the one or more processors, solar data;
receiving, at the one or more processors, conductor data;
receiving, at the one or more processors, a temperature decrement;
programmatically simulating, using the one or more processors, ampacity for normal operating conditions across a temperature range, wherein the temperature range includes a number of temperatures from a first temperature to a second temperature in a given interval between successive pairs of temperatures, wherein the given interval between the successive pairs of temperatures equals the temperature decrement received at the one or more processors;

programmatically simulating, using the one or more processors, ampacity for long term emergency (LTE) operating conditions across the temperature range;

programmatically simulating, using the one or more processors, ampacity for short term emergency (STE) operating conditions across the temperature range; and programmatically simulating, using the one or more processors, ampacity for drastic action limit (DAL) operating conditions across the temperature range, wherein the operations are performed within a single simulation.

9. The system of claim 8, wherein the conductor data includes data representing a plurality of conductors.

10. The system of claim 9, wherein the programmatically simulating ampacity for normal operating conditions, the programmatically simulating ampacity for LTE operating conditions, programmatically simulating ampacity for STE operating conditions, and programmatically simulating ampacity for DAL operating conditions are performed for each conductor of the plurality of conductors across the temperature range.

11. The system of claim 10, wherein each of the programmatically simulating ampacity for normal operating conditions, the programmatically simulating ampacity for LTE operating conditions, programmatically simulating ampacity for STE operating conditions, and programmatically simulating ampacity for DAL operating conditions, includes applying both a first technique and a second technique, wherein the first technique includes conductor surface temperature, and the second technique includes an average temperature of conductor surface and core temperatures.

12. The system of claim 11 wherein the first technique meets IEEE Standard 738-2006.

13. The system of claim 11, wherein the second technique meets IEEE Standard 738-2012.

14. The system of claim 11, further comprising generating a lookup table containing results of the programmatically simulating ampacity for normal operating conditions, the programmatically simulating ampacity for LTE operating conditions, programmatically simulating ampacity for STE operating conditions, and programmatically simulating ampacity for DAL operating conditions.

15. A non-transitory computer readable medium having stored thereon software instructions that, when executed by a processor, cause the processor to perform operations including:
receiving, at one or more processors, weather data;
receiving, at the one or more processors, solar data;
receiving, at the one or more processors, conductor data;
receiving, at the one or more processors, a temperature decrement;
programmatically simulating, using the one or more processors, ampacity for normal operating conditions across a temperature range, wherein the temperature range includes a number of temperatures from a first temperature to a second temperature in a given interval between successive pairs of temperatures, wherein the given interval between the successive pairs of temperatures equals the temperature decrement received at the one or more processors;

programmatically simulating, using the one or more processors, ampacity for long term emergency (LTE) operating conditions across the temperature range;

programmatically simulating, using the one or more processors, ampacity for short term emergency (STE) operating conditions across the temperature range; and programmatically simulating, using the one or more processors, ampacity for drastic action limit (DAL) operating conditions across the temperature range, wherein the operations are performed within a single simulation.

16. The non-transitory computer readable medium of claim 15, wherein the conductor data includes data representing a plurality of conductors and the programmatically simulating ampacity for normal operating conditions, the programmatically simulating ampacity for LTE operating conditions, programmatically simulating ampacity for STE operating conditions, and programmatically simulating ampacity for DAL operating conditions are performed for each conductor of the plurality of conductors across the temperature range.

17. The non-transitory computer readable medium of claim 16, wherein each of the programmatically simulating ampacity for normal operating conditions, the programmatically simulating ampacity for LTE operating conditions, programmatically simulating ampacity for STE operating conditions, and programmatically simulating ampacity for DAL operating conditions, includes applying both a first technique and a second technique, wherein the first technique includes conductor surface temperature, and the second technique includes an average temperature of conductor surface and core temperatures.

18. The non-transitory computer readable medium of claim 17, wherein the first technique meets IEEE Standard 738-2006.

19. The non-transitory computer readable medium of claim 17, wherein the second technique meets IEEE Standard 738-2012.

20. The non-transitory computer readable medium of claim 17, further comprising generating a lookup table containing results of the programmatically simulating ampacity for normal operating conditions, the programmatically simulating ampacity for LTE operating conditions, programmatically simulating ampacity for STE operating conditions, and programmatically simulating ampacity for DAL operating conditions.

\* \* \* \* \*